US011951476B2

(12) United States Patent
Hassan et al.

(10) Patent No.: US 11,951,476 B2
(45) Date of Patent: Apr. 9, 2024

(54) ELECTRONIC-SENSING AND MAGNETIC-MODULATION (ESMM) BIOSENSOR FOR PHAGOCYTOSIS QUANTIFICATION IN PATHOGENIC INFECTIONS AND METHODS OF USE THEREOF

(71) Applicant: Rutgers, The State University of New Jersey, New Brunswick, NJ (US)

(72) Inventors: Umer Hassan, Monmouth Junction, NJ (US); Corey Norton, Lodi, NJ (US)

(73) Assignee: Rutgers, The State University of New Jersey, New Brunswick, NJ (US)

(*) Notice: Subject to any disclaimer, the term of this patent is extended or adjusted under 35 U.S.C. 154(b) by 161 days.

(21) Appl. No.: 17/519,223

(22) Filed: Nov. 4, 2021

(65) Prior Publication Data

US 2022/0152611 A1      May 19, 2022

Related U.S. Application Data

(60) Provisional application No. 63/116,236, filed on Nov. 20, 2020, provisional application No. 63/115,647, filed on Nov. 19, 2020.

(51) Int. Cl.
*B01L 3/00* (2006.01)
*C12M 3/06* (2006.01)
(Continued)

(52) U.S. Cl.
CPC ... *B01L 3/502715* (2013.01); *B01L 3/502707* (2013.01); *G01N 35/0098* (2013.01);
(Continued)

(58) Field of Classification Search
CPC ......... B01L 3/502715; B01L 3/502707; B01L 2200/0668; B01L 2300/0636;
(Continued)

(56) References Cited

U.S. PATENT DOCUMENTS

| 6,133,043 A | * | 10/2000 | Talley | ................. | G01N 21/69 |
| | | | | | 250/361 C |
| 2007/0207548 A1 | * | 9/2007 | Blankenstein | ......... | B03C 1/035 |
| | | | | | 436/63 |

(Continued)

FOREIGN PATENT DOCUMENTS

EP      1207959 B1      5/2008

OTHER PUBLICATIONS

Germano et al., "A Portable and Autonomous Magnetic Detection Platform for Biosensing," Sensors 2009, 9, pp. 4119-4137.
(Continued)

*Primary Examiner* — Jennifer Wecker
*Assistant Examiner* — Oyeleye Alexander Alabi
(74) *Attorney, Agent, or Firm* — Greenberg Traurig, LLP

(57) ABSTRACT

An electronic-sensing & magnetic-modulation (ESMM) biosensor device and methods of using the same, where the device incorporates electrical, microfluidic, and magnetic subsystems. The device and methods of using such a device can be applied to high throughput point-of-care screening for the quantification and evaluation of a subject's immune response to pathogenic infections, which can be useful for: early diagnosis, stratifying high-risk subjects infected with a pathogen; and determining the status or effectiveness of a therapeutic response.

15 Claims, 17 Drawing Sheets

(51) Int. Cl.
*G01N 35/00* (2006.01)
*G03F 7/00* (2006.01)
*G03F 7/038* (2006.01)
*G03F 7/20* (2006.01)
*G03F 7/32* (2006.01)
*G06N 3/08* (2023.01)
*G06N 20/00* (2019.01)
*H01F 1/053* (2006.01)
*H01F 7/02* (2006.01)

(52) U.S. Cl.
CPC ............ *B01L 2200/0668* (2013.01); *B01L 2300/0636* (2013.01); *B01L 2300/0645* (2013.01); *B01L 2300/0883* (2013.01); *G03F 7/0037* (2013.01); *G03F 7/0382* (2013.01); *G03F 7/2004* (2013.01); *G03F 7/322* (2013.01); *G06N 3/08* (2013.01); *G06N 20/00* (2019.01); *H01F 1/053* (2013.01); *H01F 7/02* (2013.01)

(58) Field of Classification Search
CPC ..... B01L 2300/0645; B01L 2300/0883; G01N 35/0098; G01N 15/1056; G01N 2015/1006; G01N 15/1031; G03F 7/0037; G03F 7/0382; G03F 7/2004; G03F 7/322; G06N 20/00; G06N 3/048; H01F 1/053; H01F 7/02; H01F 1/28; B33Y 10/00
See application file for complete search history.

(56) References Cited

U.S. PATENT DOCUMENTS

2016/0320374 A1* 11/2016 Lowe ................ G01N 27/3277
2021/0355418 A1* 11/2021 Saito ..................... C12M 35/02
2021/0394182 A1* 12/2021 Sarioglu ............ G01N 15/1245

OTHER PUBLICATIONS

Spijkerman et al., "Automated flow cytometry enables high performance point-of-care analysis of leukocyte phenotypes," Journal of Immunological Methods 2019, vol. 474, 13 pages.

Shoshi et al., "Magnetoresistive-based real-time cell phagocytosis monitoring," Biosensors and Bioelectronics 2012, vol. 36, pp. 116-122.

* cited by examiner

Confusion Matrix (Phagocytosis)

| | | 0 | 1 | |
|---|---|---|---|---|
| Output Class | 0 | 16<br>47.1% | 3<br>8.8% | 84.2%<br>15.8% |
| | 1 | 1<br>2.9% | 14<br>41.2% | 93.3%<br>6.7% |
| | | 94.1%<br>5.9% | 82.4%<br>17.6% | 88.2%<br>11.8% |
| | | 0 | 1 | |

Target Class

$$TPR = \frac{TP}{TP + FN}$$

(sensitivity)

$$FPR = \frac{FP}{FP + TN}$$

(1 − specificity)

Confusion Matrix (Sepsis)

|  |  | 0 | 1 |  |
|---|---|---|---|---|
| Output Class | 0 | 7<br>41.2% | 0<br>0.0% | 100%<br>0.0% |
|  | 1 | 2<br>11.8% | 8<br>47.1% | 80%<br>20% |
|  |  | 77.8%<br>22.2% | 100%<br>0.0% | 88.2%<br>11.8% |
|  |  | 0 | 1 |  |

Target Class

$$TPR = \frac{TP}{TP + FN}$$

(sensitivity)

$$FPR = \frac{FP}{FP + TN}$$

(1 − specificity)

Top Electrode Radius: r1
Bottom electrode Inner Radius: r2
Bottom Electrode Outer Radius: r3

ELECTRONIC-SENSING AND MAGNETIC-MODULATION (ESMM) BIOSENSOR FOR PHAGOCYTOSIS QUANTIFICATION IN PATHOGENIC INFECTIONS AND METHODS OF USE THEREOF

CROSS-REFERENCE TO RELATED APPLICATIONS

This application claims the benefit of and priority to U.S. Provisional Application No. 63/115,647, filed Nov. 19, 2021, and also claims the benefit of and priority to U.S. Provisional Application No. 63/116,236, filed Nov. 20, 2021, which are incorporated herein by reference in its entirety.

FIELD OF DISCLOSURE

The present disclosure generally relates to methods and systems for detecting and characterizing cells in a biological system.

BACKGROUND

Phagocytosis is a process by which phagocytic leukocytes or phagocytes attack foreign pathogens (e.g., bacteria, viruses, fungi, parasites) in a host or subject by engulfing and internalizing them by digestion. This process is a critical function of the innate immune system and an important process to monitor in subjects suffering from infections. However, commercially available technologies to quantify and monitor phagocytosis in a subject, including flow cytometry and immunoassays, are both expensive and time consuming.

SUMMARY

Embodiments of the disclosure provide a device, comprising: a substrate (e.g., glass, silicon chip); at least two electrodes (e.g., 2, 3); a microfluidic channel comprising at least one inlet and an outlet; and at least one magnet (e.g., electromagnetic or permanent; neodymium (Nd), neodymium iron boron (NdFeB), samarium cobalt (SmCo), alnico, ceramic, lodestone, ferrite magnets) having opposite polarities); where the at least two electrodes are disposed on the substrate, where the microfluidic channel is disposed in proximity or adjacent to the at least two electrodes on the substrate, where the at least two electrodes are configured to generate an electric field, and where the at least one magnet is configured to provide a magnetic field (e.g., constant) in at least a portion or region of the microfluidic channel.

In one aspect of the embodiment, the device can further comprise at least one magnetic particle (e.g., ferromagnetic particle). Another aspect provides the device where the substrate is or is made of, but not limited to, glass, silicon, elastomeric polymer, thermoplastic polymer, polydimethylsiloxane (PDMS), polymethyl methacrylate (PMMA), polycarbonate (PC), polystyrene (PS), cyclic olefin copolymer (COC), cyclic olefin polymer (COP), polyethylene terephthalate (PET), Parylene, off-stoichiometry thiol-enes (OSTE), or combinations thereof. A further aspect provides an electrode selected from, but not limited to: gold (Au), silver (Ag), platinum (Pt), aluminum (Al), copper (Cu), palladium (Pd), tin (Sn), germanium (Ge), bismuth (Bi), sodium (Na), lithium (Li), and magnesium (Mg). One aspect can be directed to a device comprising, consisting essentially of, or consisting of two magnets, where each magnet has opposing polarities. Yet another aspect of the device embodiment can provide an electromagnet or a permanent magnet (e.g., neodymium iron boron (NdFeB), samarium cobalt (SmCo), alnico, and ceramic or ferrite magnets). In a further aspect, the device of the disclosure provides at least one magnetic particle that is a ferromagnetic particle (e.g., iron, nickel, cobalt, or their alloys). One aspect can be directed to a device where the microfluidic channel is configured in a shape selected from, but not limited to, rectangular, circular, triangular, polygonal, horseshoe, zig-zag, infinity symbol, or the like, arranged in different configurations selected from: co-planar, top-bottom, or a combination thereof. In yet another aspect of the device embodiment, at least one magnet can be positioned adjacent to the microfluidic channel A further aspect of the device embodiment can provide two magnets independently disposed on either side of the microfluidic channel, where the polarity at one end of a magnet is the opposite of another magnet in close proximity.

Another embodiment of the disclosure provides a method comprising, consisting essentially of, or consisting of: applying a sample (e.g., whole blood, phagocytes, neutrophils, monocytes, macrophages) to the device, where the sample comprises at least one cell (e.g., phagocytic cell, white blood cell, red blood cell); incorporating at least one magnetic particle (e.g., 5,000-50,000) to the sample; applying an input voltage (e.g., 1 V-10 V) of at least a single frequency (e.g., 250 kHz-10 MHz) to the electrodes, thereby generating an electric field; passing the sample from the inlet or inlets to the outlet of the microfluidic channel through the electric field (e.g., at a flow rate of 5-50 µl/minute); measuring a current signal from each of the two or more electrodes, producing a pulse; and detecting the pulse or pulse parameters. A further aspect of the method embodiment provides the step of amplifying the current signal. Another aspect of the method embodiment can be directed to a pulse having parameters of an amplitude or absolute amplitude of 0 V-1 V; a pulse width of 0.02 ms-2 ms; a rise time of 0.01 ms-2 ms (e.g., 0.01 ms-1 ms); a fall time of 0.01 ms-2 ms (e.g., 0.01 ms-1 ms); a normalized width differential factor (NWDF) of −0.1-0.1; or combinations thereof. In a further aspect of the method embodiment, a pulse of a cell with at least one magnetic particle can comprise an amplitude, a pulse width, a rise time, a fall time, a NWDF, or combinations thereof that is less than that in a pulse of a cell without at least one magnetic particle. One aspect of the method embodiment provides a pulse of a cell with at least one magnetic particle that comprises an amplitude, a pulse width, a rise time, a fall time, and a NWDF less than an amplitude, a pulse width, a rise time, a fall time, and a NWDF of a pulse of a cell without at least one magnetic particle. Another aspect of the method embodiment can be directed to the application of a sample comprising at least one phagocytic cell. In yet another aspect of the method embodiment, the presence or absence of at least one phagocytic cell can be detected. A further aspect of the method embodiment can provide quantifying the number of internalized magnetic particles, which correlates to the number of phagocytic cells.

One embodiment can be directed an apparatus comprising a substrate (e.g., glass); two or three electrodes; a microfluidic channel comprising at least one inlet and an outlet; and two permanent magnets (e.g., neodymium), where the two or three electrodes are disposed on the substrate, where the microfluidic channel is disposed on or to the two or three electrodes on the substrate, where the two or three electrodes are configured to generate an electric field, and where the two permanent magnets are configured to generate a magnetic field in at least a portion of the microfluidic channel. In some aspects of the apparatus embodiment, at least a portion of the microfluidic channel can be arranged perpendicularly to the two or three electrodes. The apparatus in another aspect of the embodiment can further comprise at least one ferromagnetic particle.

BRIEF DESCRIPTION OF FIGURES

Various embodiments of the present disclosure can be further explained with reference to the attached drawings, wherein like structures are referred to by like numerals throughout the several views. The drawings shown are not necessarily to scale, with emphasis instead generally being placed upon illustrating the principles of the present disclosure. Therefore, specific structural and functional details disclosed herein are not to be interpreted as limiting, but merely as a representative basis for teaching one skilled in the art to variously employ one or more illustrative embodiments.

DETAILED DESCRIPTION

Figure 1A:
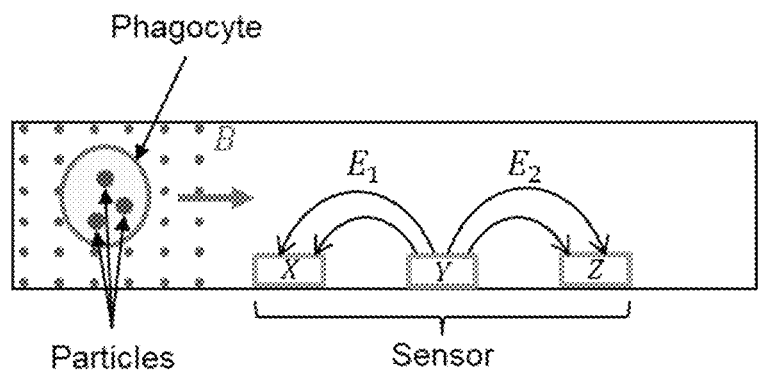
FIG. 1A shows a side view of a biosensor of the disclosure and bipolar pulse generated by passing a phagocytic cell comprising ferromagnetic particles over the biosensor (FIG. 1B). Applying an AC voltage course to the middle electrode Y generates electric fields between electrode Y and electrodes X and Z on either side.

Detailed embodiments of the present disclosure, taken in conjunction with the accompanying figures, are disclosed herein; however, it is to be understood that the disclosed embodiments are merely illustrative of the disclosure that can be embodied in various forms. In addition, each of the examples given in connection with the various embodiments of the disclosure is intended to be illustrative, and not restrictive.

Definitions

All terms used herein are intended to have their ordinary meaning in the art unless otherwise provided. All concentrations are in terms of percentage by weight of the specified component relative to the entire weight of the topical composition, unless otherwise defined.

The phrases "in one embodiment" and "in some embodiments" as used herein do not necessarily refer to the same embodiment(s), though it can. Furthermore, the phrases "in another embodiment" and "in some other embodiments" as used herein do not necessarily refer to a different embodiment, although it can. Thus, as described below, various embodiments can be readily combined, without departing from the scope or spirit of the present disclosure.

In addition, the term "based on" is not exclusive and allows for being based on additional factors not described, unless the context clearly dictates otherwise. As used herein, "a," "an," or "the" shall mean one or more, i.e., include plural references. As used herein when used in conjunction with the word "comprising," the words "a" or "an" mean one or more than one. The meaning of "in" includes "in" and "on." As used herein "another" means at least a second or more.

As used herein, all ranges of numeric values include the endpoints and all possible values disclosed between the disclosed values. The exact values of all half-integral numeric values are also contemplated as specifically disclosed and as limits for all subsets of the disclosed range. For example, a range of from 0.1% to 3% specifically discloses a percentage of 0.1%, 1%, 1.5%, 2.0%, 2.5%, and 3%. Additionally, a range of 0.1 to 3% includes subsets of the original range including from 0.5% to 2.5%, from 1% to 3%, from 0.1% to 2.5%, etc. It will be understood that the sum of all weight % of individual components will not exceed 100%.

Throughout this description, various components can be identified having specific values or parameters, however, these items are provided as exemplary embodiments. Indeed, the exemplary embodiments do not limit the various aspects and concepts of the present disclosure as many comparable parameters, sizes, ranges, and/or values can be implemented. Unless otherwise specified, the terms "first," "second," and the like, "primary," "secondary," and the like, do not denote any order, quantity, or importance, but rather are used to distinguish one element from another.

By "consist essentially" it is meant that the ingredients include only the listed components along with the normal impurities present in commercial materials and with any other additives present at levels which do not affect the operation of the disclosure, for instance at levels less than 5% by weight or less than 1% or even 0.5% by weight.

As used herein, by "permanent magnet" it is meant that a material maintains its magnetic properties in the absence of an inducing field or current. Exemplary permanent magnets include, but are not limited to, neodymium, such as neodymium iron boron (NdFeB); samarium cobalt (SmCo); alnico; ceramic; lodestone; and ferrite magnets.

By "signal" it is meant information conveyed by a particular means (e.g., electrical, current, voltage, digital) about the characteristics or behavior of interest. The term "signal" can provide information about, for example, the quantity, quality, and other aspects of cells (or their interactions) in a biosensor as presented here, where cells pass through electrical and magnetic fields.

As used herein, the term "subject" refers to any organism who can take advantage of the benefits of the device accordance with the disclosure, e.g., for experimental, diagnostic, prophylactic, and/or therapeutic purposes. Typical subjects include any animal (e.g., mammals such as mice, rats, rabbits, non-human primates, dogs, cats, horses, and humans, etc.). A subject in need thereof is typically a subject for whom it is desirable to monitor treatment of a disease, disorder, or condition as described here by quantifying and qualifying characteristics of cells important in fighting foreign pathogenic infections. For example, a subject in need thereof can seek or be in need of treatment, require treatment, be receiving treatment, can be receiving treatment in the future, or a human or animal that is under care by a trained professional for a particular disease, disorder, or condition.

Device

Embodiments of the disclosure provide a biosensing framework designed to detect the phagocytic capability of an infected subject's immune system. In addition to monitoring a patient's immune response to a pathogenic infection, this device, sensor, or apparatus, used interchangeably here, can provide an alternative tool for sepsis diagnosis by an enhanced presence of phagocytic cells or phagocytes (e.g., white blood cells, neutrophils, monocytes, macrophages, mast cells, dendritic cells) in the bloodstream at the onset of sepsis.

In one embodiment, a sample or a biological sample from a subject can be tested. Some embodiments of the disclosure provide samples selected from but not limited to: tissue, organs (e.g., brain, lung, skin, liver), whole blood, pus, phagocytes, white blood cells, neutrophils, monocytes, macrophages, mast cells, dendritic cells, and the like.

Another embodiment can provide a sample pre-processed for use with the device of the disclosure. For example, the tissue, organ, and whole blood samples obtained from subjects suspected of suffering from sepsis or who are healthy and not suffering from sepsis can be processed to isolate cells of interest, such as but not limited to, phagocytes, neutrophils, monocytes, macrophages, mast cells, dendritic cells. In some embodiments, the tissue or organ samples can first be minced and digested to a cellular level. The sample applied to the device of the invention can be in a volume of, but not limited to, 1 μl or greater (e.g., 2 μl, 3 μl, 4 μl, 5 μl, 6 μl, 7 μl, 8 μl, 9 μl, 10 μl); 1 ml or less (e.g., 500 μl, 250 μl, 100 μl, 50 μl, 10 μl, 9.5 μl, 8.5 μl, 7.5 μl, 6.5 μl, 5.5 μl, 4.5 μl, 3.5 μl, 2.5 μl, 1.5 μl); or 1 μl-1 ml (e.g., 1.75 μl-600 μl; 2.75 μl-400 μl; 3.75 μl-200 μl; 4.75 μl-100 μl; 5.75 μl-75 μl; 6.75 μl-55 μl; 7.75 μl-35 μl; 8.75 μl-15 μl; 9.75 μl-12 μl). In instances where a tissue or organ sample are provided, the cells are disassociated from the tissue. Commonly known and used techniques for cell isolation or separation can be utilized. Non-limiting examples of cell isolation or separation techniques include: digesting tissues or organ samples, flow cytometry, magnetic separation, density gradient centrifugation, immunodensity cell isolation, sedimentation, and adhesion.

The samples of the disclosure can also be incorporated with at least one magnetic particle (e.g., 5,000-50,000/1 mL of whole blood), either before application of the sample to the device or while on the device. The magnetic particles can be opsonized to simulate the presence of pathogens (e.g., bacteria, viruses, fungi, parasites) in a sample of the disclosure. The magnetic particles of the disclosure can be ferromagnetic microparticles composed of materials such as but not limited to iron, nickel, cobalt, or their alloys. These particles can approximately be the size of an average pathogen (e.g., 0.01 μm or greater; 25 μm or less; 0.01 μm-25 μm; 0.02 μm-15 μm; 0.1 μm-10 μm; 0.2 μm-5 μm; 0.25 μm-4 μm; 0.5 μm-4 μm; 0.7 μm-3.8 μm; 1 μm-3.5 μm; 2 μm-2.5 μm) in diameter. These magnetic particles can be artificially coated with a markers (e.g., ligand) typically present on a pathogen such that corresponding markers that identifies the magnetic particle markers (e.g., receptor molecules) on the phagocytic cells in the sample can bind to the magnetic particles, which initiates the phagocytic process. However, since the particles are made of a non-organic ferrous material, they cannot be digested by the phagocyte and will instead remain indefinitely trapped within a vesicle.

Figure 1B:
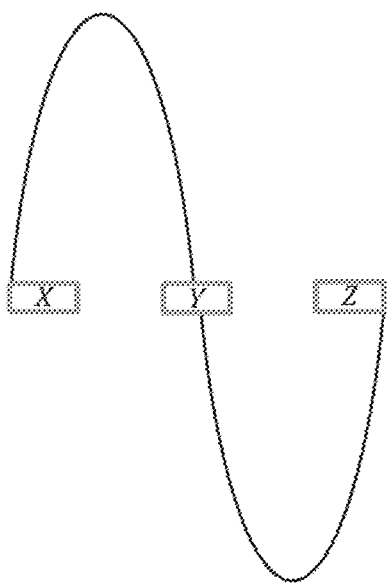

Magnetic particles within functional phagocytes allow a magnetic field to manipulate the cells. The sample can be incorporated with at least one magnetic particle (e.g., 100 or more (e.g., 500; 1,000; 1,500; 2,000; 2,500; 3,000; 3,500; 4,000; 4,500; 5,000; 10,000; 20,000; 30,000; 40,000; 50,000); 100,000 or fewer (e.g., 75,000; 50,500; 40,500; 30,500; 20,500; 10,500; 9,500; 8,500; 7,500; 6,500; 5,500; 4,500; 3,500; 2,500; 1,500; 500); 100-100,000 (e.g., 150; 200; 250; 300; 350; 400; 450; 500; 600; 700; 800; 900; 1,000; 2,000; 3,000; 4,000; 5,000; 10,000; 25,000)). In some embodiments, the magnetic particle is a ferromagnetic particle (e.g., iron, nickel, cobalt, or their alloys). A magnetic field can be used to selectively modify the speed or flow rate of functional phagocytes in a microfluidic system. This magnetic field can also be coupled with an impedimetric cell sensor in order to record this change or modulation as shown in FIG. 1A and FIG. 1B. An embodiment of the disclosure can be directed to a microelectromechanical POC framework utilizing this concept and can be explained by its three constituent subsystems: electrical, and microfluidic, and magnetic. Another embodiment provides a device that detects a higher impedance of a biological cell than its surrounding fluid, which is relatively conductive.

The electrical subsystem of the device of the disclosure capitalizes on the arrangement of electrodes as a biological cell passes through a generated electric field upon alternating current voltage application. In one example as presented in FIG. 1A, a current signal can be measured from the electrodes, where a difference between the two current signals can be taken in order to stabilize the baseline of the signal ($I_{diff}=I_{YX}-I_{YZ}$). Upon cell disruption of one of these electric fields, an increased impedance to the system manifests as a change in the corresponding current signal. A bipolar pulse in the differential current signal can be shown in FIG. 1B. The amplitude and width of this pulse contains information about the cell being analyzed, namely its volume and its flow speed.

Figure 2:
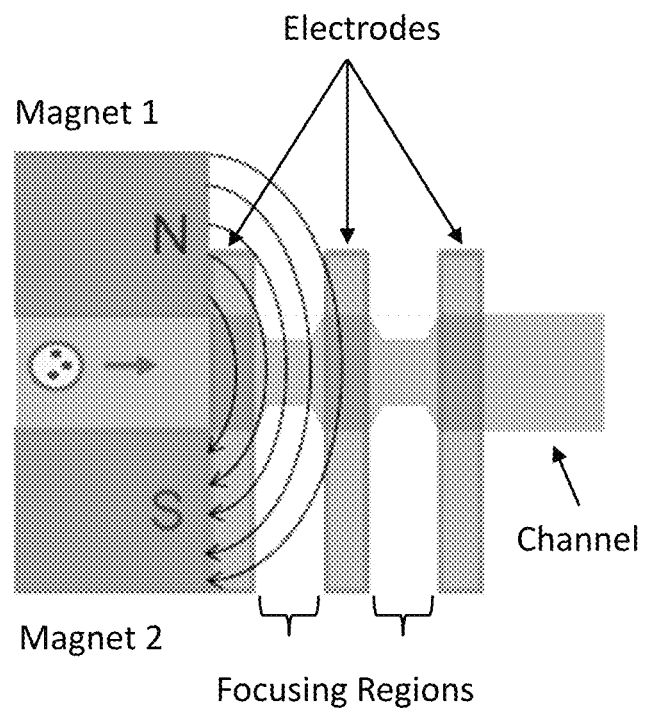
FIG. 2 illustrates an exemplary full sensor design comprising two permanent neodymium magnets with opposite polarities upstream of the sensing region, where the magnets provide a constant magnetic field in a portion of the microfluidic channel Focusing regions of the channel can be narrower in width and located in between or on each pair of electrodes.

In the microfluidic subsystem of the device of the disclosure, a microfluidic channel linear channel having at least two focusing regions and one or more inlets and/or outlets. Through the length of the microfluidics channel, the width can vary. The microfluidic channel allows for a sample of interest to flow through the sensing region formed by the electrical subsystem in a controlled manner by undergoing laminar flow throughout the entirety of the channel, ensuring that all of the cells of the sample pass through the sensing region in a streamlined fashion. FIG. 2 illustrates an exemplary biosensor that shows two focusing regions of the microfluidic channel that lie between each pair of electrodes in the electrical subsystem. In other embodiments, the focusing regions can be on or over the electrodes. These focusing regions of the channel can focus the electric field into a smaller volume of the conductive fluid of the channel, thereby increasing the current density in that constricted region. In some embodiments, an increase in current density in the sensing region allows for an improved signal-to-noise ratio (SNR) in the measured differential current signal. Other embodiments can be directed to a microfluidic channel with walls fabricated with a non-conductive material.

In the magnetic subsystem of the device of the disclosure, at least one magnet with opposite polarities can be arranged upstream of the sensing region to provide a constant magnetic field in a portion of the microfluidic channel in FIG. 2. The generated magnetic field can alter the flow rate of phagocytes passing through the sensing region that have internalized ferromagnetic microparticles. As the microparticles flow into close proximity to the magnetic field from upstream, they can become polarized and magnetically attracted towards it. This increases the overall speed of the cell containing the particles and subsequently reduces the corresponding pulse width measured from the differential current. As the microparticles move downstream, away from the magnetic field, the polarized particles are still magnetically attracted towards the field. This attractive force decreases the overall speed of the cell containing the particles, and subsequently increases the corresponding pulse width measured form the differential current. In this way, the magnetic subsystem causes a disruption of the sample flow due to the presence of functional phagocytes which can be measured by the electrical subsystem.

Figure 3:
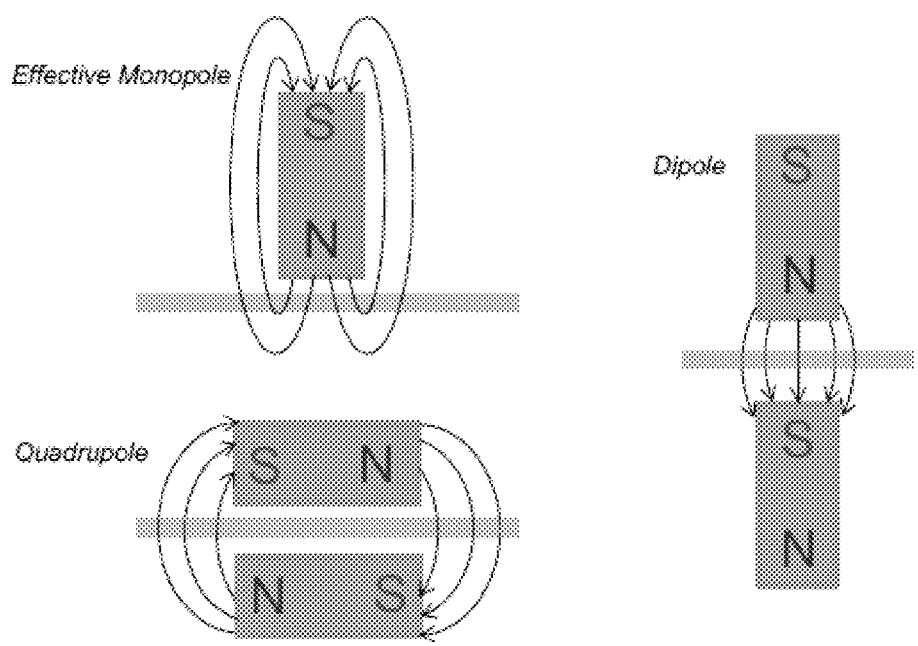
FIG. 3 illustrates various magnetic field configurations: effective monopole, dipole, and quadrupole.

Another embodiment can be directed to several different configurations of permanent magnets: an effective monopolar configuration, a dipolar configuration, and a quadrupolar configuration as shown in FIG. 3. The monopolar configuration can be disproportionately close to one magnetic pole as compared to the other thereby providing the least uniform magnetic field throughout the channel as compared to the other configurations, it can be used in some embodiments. The dipole and quadrupole configurations provide a more uniform magnetic field throughout the channel as compared to the monopolar configuration. In these configurations, the north and south poles of two distinct permanent magnets can be utilized in conjunction with one another to form a more complex magnetic field profile. The biggest difference between these two configurations is the volume of the channel affected by the magnetic fields. The quadrupole configuration provides a magnetic field which is strong at either end of the permanent magnets, and weaker elsewhere in the channel. This type of field profile can be beneficial because it can be used to impose a force on the microparticles only in the sensing region, preventing the change in velocity caused by the magnetic force from overcoming the constant velocity derived from pressure-driven flow of the microfluidic system. This can prevent the inadvertent capture of cells in the system and subsequent clogging of the microfluidic channel. In some embodiments, the quadrupole configuration can be used in the device of the disclosure.

An embodiment of the disclosure can provide a device comprising, consisting essentially of, or consisting of: a substrate; at least two electrodes, a microfluidic channel comprising at least one inlet and an outlet; and at least one magnet, where the electrodes are disposed or configured to be disposed on the substrate, where the microfluidic channel is disposed or configured to be disposed in proximity to the at least two electrodes on the substrate, where the at least two electrodes are configured to generate an electric field, and the at least one magnet is configured to generate a magnetic field in at least a portion of the microfluidic channel. In another embodiment, the device of the disclosure can further comprise at least one magnetic particle for incorporation or internalization in phagocytic cells of a sample.

In one embodiment, a device of the disclosure can comprise, consist essentially of, or consist of: a substrate of any flexible and/or hard substrate (e.g., glass, silicon (e.g., silicon chip), elastomeric polymer, thermoplastic polymer, polydimethylsiloxane (PDMS), polymethyl methacrylate (PMMA), polycarbonate (PC), polystyrene (PS), cyclic olefin copolymer (COC), cyclic olefin polymer (COP), polyethylene terephthalate (PET), parylene, off-stoichiometry thiol-enes (OSTE), combinations thereof); at least two electrodes (e.g., 3, 4, 5, 6); a microfluidic channel comprising at least one inlet (e.g., 2, 3, 4, 5) and an outlet through which a sample can enter and exit the device; and at least one magnet, such as for example, an electromagnetic magnet or permanent magnet (e.g., neodymium iron boron (NdFeB), samarium cobalt (SmCo), alnico, ceramic, lodestone, ferrite magnets) where the magnet has opposite polarities. Exemplary magnets of the disclosure can have a width of 100 µm or greater (e.g., 125 µm; 175 µm; 225 µm; 275 µm; 325 µm; 375 µm; 425 µm; 475 µm); 500 µm or less (e.g., 450 µm; 350 µm; 250 µm; 150 µm); or 100 µm-500 µm (e.g., 125 µm-450 µm; 150 µm-400 µm; 175 µm-350 µm; 200-300 µm); height of 50 µm or greater (e.g., 100 µm; 125 µm; 175 µm; 225 µm; 275 µm; 325 µm; 375 µm; 425 µm; 475 µm); 500 µm or less (e.g., 450 µm; 350 µm; 250 µm; 150 µm; 100 µm); or 50 µm-500 µm (e.g., 100 µm-475 µm; 125 µm-450 µm; 150 µm-400 µm; 175 µm-350 µm; 200-300 µm); and/or a depth of 50 µm or greater (e.g., 100 µm; 125 µm; 175 µm; 225 µm; 275 µm; 325 µm; 375 µm; 425 µm; 475 µm); 500 µm or less (e.g., 450 µm; 350 µm; 250 µm; 150 µm; 100 µm); or 50 µm-500 µm (e.g., 100 µm-475 µm; 125 µm-450 µm; 150 µm-400 µm; 175 µm-350 µm; 200-300 µm). Use of one magnet or two magnets orientated in opposite polarities can generate the required magnetic field for modulation. In some embodiments, the microfluidic channel of the device can have a width of 15 µm or greater (e.g., 30 µm; 50 µm; 100 µm); 100 µm or less (e.g., 75 µm; 25 µm; 15 µm); or 15 µm-100 µm (e.g., 20 µm-90 µm; 35 µm-80; 45 µm-70 µm; 55 µm-60 µm); and a height of at least 5 µm (e.g., 15 µm; 25 µm; 35 µm; 45 µm; 55 µm); 50 µm or less (e.g., 40 µm; 30 µm; 20 µm; 10 µm); or 5 µm-50 µm; 10 µm-45 µm; 15 µm-40 µm; 20 µm-35 µm).

The electrode and microfluidic channel are both disposed on the substrate, where the microfluidic channel is disposed on the substrate in close proximity and/or adjacent to the electrodes or portions of the electrodes. In some embodiments, the substrate comprises the electrode and the microfluidic channel, where the microfluidic channel of the substrate is configured to be in close proximity and/or adjacent to the one or more electrodes or portions of the one or more electrodes at a distance sufficient to generate an electric field. The microfluidic channel can be disposed (or configured to be disposed) on the substrate, for example, perpendicularly, transversally, or parallel, to the at least two electrodes on the substrate. Another embodiment directed to a device with two magnets, for example in a quadrupole configuration, can be disposed or configured to be disposed (e.g., independently) on either side of the microfluidic channel. The at least one magnet (e.g., permanent, electromagnetic) can be configured to provide a magnetic field or constant magnetic field in at least a portion of the microfluidic channel while the at least two electrodes can be configured to generate an electric field. Other embodiments provide for a microfluidic channel configured in a shape selected from, but not limited to: rectangular, circular, triangular, polygonal, horseshoe, zig-zag, infinity symbol arranged in different configurations selected from: co-planar, top-bottom, or a combination thereof.

Another embodiment provides a device with an electrical subsystem comprising, consisting essentially of, or consisting of at least two electrodes (e.g., 3, 4, 5, 6) of a material selected from, but not limited to, gold (Au), silver (Ag), platinum (Pt), aluminum (Al), copper (Cu), palladium (Pd), tin (Sn), germanium (Ge), bismuth (Bi), sodium (Na), lithium (Li), and magnesium (Mg). The electrodes of the disclosure can be coplanar with inter-electrode spacing sufficient to function as an impedimetric sensor. The electrodes can be disposed on a substrate (e.g., glass, silicon, elastomeric polymer, thermoplastic polymer, polydimethylsiloxane (PDMS), polymethyl methacrylate (PMMA), polycarbonate (PC), polystyrene (PS), cyclic olefin copolymer (COC), cyclic olefin polymer (COP), combinations thereof) in a manner sufficient to generate an electrical signal. The size of the electrodes can be 1 µm or greater (e.g., 5 µm, 15 µm, 25 µm, 50 µm, 100 µm, 150 µm, 200 µm, 250 µm, 500 µm); 500 µm or less (e.g., 375 µm, 275 µm, 175 µm, 125 µm, 95 µm, 75 µm, 55 µm, 20 µm, 10 µm); or 1 µm-500 µm (e.g., 10 µm-400 µm; 20 µm-300 µm; 30 µm-225 µm; 40 µm-195 µm; 60 µm-120 µm; 70 µm-110 µm; 80 µm-105 µm). The inter-electrode spacing on the substrate can be, but not limited to, 1 µm or greater (e.g., 5 µm, 15 µm, 25 µm, 50 µm, 100 µm, 150 µm, 200 µm, 250 µm, 500 µm); 500 µm or less (e.g., 375 µm, 275 µm, 175 µm, 125 µm, 95 µm, 75 µm, 55 µm, 20 µm, 10 µm); or 1 µm-500 µm (e.g., 10 µm-400 µm; 20 µm-300 µm; 30 µm-225 µm; 40 µm-195 µm; 60 µm-120 µm; 70 µm-110 µm; 80 µm-105 µm).

In one embodiment, the device of the disclosure can be used to detect the presence or absence of functional phagocytic cells in a biological sample collected from a subject. For example, a sample of a septic subject's leukocytes can be introduced to opsonized ferromagnetic microparticles, which are ingested by healthy functioning phagocytes. The sample flows through a counting region comprising, consisting essentially of, or consisting of three coplanar electrodes and two permanent magnets. See, e.g., FIG. 5B. A voltage signal can be applied to the middle or center electrode and a differential current signal can be measured between the two outer electrodes. As each cell passes over the electrodes, a specific impedance can be introduced to the system based on its size and flow rate. This impedance results in the generation of a unique bipolar electrical footprint. Since the flow rate of phagocytes that have ingested the ferromagnetic microparticles can be affected by the magnetic field generated by the permanent magnets, these cells can therefore generate a notably distinct electrical footprint allowing for quantification of these cells.

A further embodiment can provide for a device, apparatus, or system comprising: a substrate, such as a glass substrate; at least two electrodes, such as two or three electrodes; a microfluidic channel comprising at least one inlet and an outlet; and two permanent magnets, such as neodymium magnets having opposite polarities; where the two or three electrodes disposed on or configured to be disposed or arranged on the substrate, where the microfluidic channel disposed on or to the two or three electrodes on the substrate, where the microfluidic channel in some embodiments can be disposed or configured to be disposed perpendicularly to the electrodes, where the electrodes configured to generate an electric field, and where the two permanent magnets configured to generate a magnetic field in at least a portion or region of the microfluidic channel. The device, apparatus, or system can also comprise at least one ferromagnetic particle, reagents (e.g., lysis buffer; quenching buffer), and/or elements configured to isolate desired cells, such as but not limited to, phagocytes, white blood cells, neutrophils, monocytes, macrophages, mast cells, dendritic cells, or combinations thereof.

Method

In order to assess and monitor subjects suffering from pathogenic infections or sepsis, available clinical processes for sepsis diagnosis and monitoring fail to provide clinicians with sufficient information to develop individualized treatments for such infected subjects. Specific pathogen information and subject immunoresponse information can be advantageously used to focus on individualized treatments and trend away from use of broad-spectrum antibiotics. However, systems for rapidly acquiring important immunoresponse metrics (e.g., phagocytic detection and quantification) from septic subjects is currently lacking. Accordingly, development of a point-of-care (POC) device to perform such diagnostic measurements could potentially reduce the mortality rate of septic patients by facilitating early detection and treatment.

One embodiment of the disclosure provides a method comprising, consisting essentially of, or consisting of: applying a sample to the device of the disclosure; incorporating at least one magnetic particle to the sample; applying an input voltage of at least a single frequency (e.g., 250 kHz or greater; 10 MHz or less; 250 kHz-10 MHz) to the at least two electrodes, thereby generating an electric field; passing the sample from the inlet to the outlet of the microfluidic channel through the electric field (at a flow rate of, for example, 1 µl/minute (µl/min) or greater (e.g., 2.5 µl/min; 5 µl/min; 10 µl/min; 20 µl/min; 30 µl/min; 40 µl/min; 50 µl/min); 100 µl/min or less (e.g., 75 µl/min; 50 µl/min; 25 µl/min; 15 µl/min; 5 µl/min); or 1 µl/min-100 µl/min (e.g., 2 µl/min; 4 µl/min; 6 µl/min; 8 µl/min; 12 µl/min; 14 µl/min; 16 µl/min; 18 µl/min; 22 µl/min; 24 µl/min; 26 µl/min; 28 µl/min; 32 µl/min; 34 µl/min; 36 µl/min; 38 µl/min; 42 µl/min; 44 µl/min; 46 µl/min; 48 µl/min)); measuring a current signal from each of the at least two electrodes, producing a pulse; and detecting the pulse. In some embodiments where after signal processing, the sensors emit an output unipolar voltage of 0 V or greater (e.g., 0.01 V; 0.05 V; 0.1 V; 0.5 V; 1 V; 1.5 V; 2 V); 2 V or less (e.g., 1.75 V; 1.25 V; 0.75 V; 0.25 V; 0.15 V; 0.07 V); or 0 V-2V (e.g., 0.02 V-1.8 V; 0.04 V-1.6 V; 0.06 V-1.4 V; 0.08 V-1.2 V; 0.12 V-0.8 V; 0.14 V-0.6 V; 0.16 V-0.4 V; 0.18 V-0.2 V) for two electrodes or an output bipolar voltage of −1 V or greater (e.g., −0.8 V; −0.6 V; −0.4 V; −0.2 V; 0 V; +0.2 V; +0.4 V; +0.6 V; +0.8 V); +1 V or less (e.g., +0.9 V; +0.7 V; +0.5 V; +0.3 V; +0.1 V; −0.1 V; −0.3 V; −0.5 V; −0.7 V; −0.9 V); −1 V to +1 V (e.g., −0.9 V; −0.7 V; −0.5 V; −0.3 V; −0.1 V; 0 V; +0.2 V; +0.4 V; +0.6 V; +0.8 V) for a differential signal with three electrodes. Another embodiment can be directed to sampling an analog signal to acquire a digital signal at a particular sampling frequency of 50 kHz or greater (e.g., 60 kHz; 70 kHz; 80 kHz; 90 kHz; 100 kHz; 200 kHz; 300 kHz; 400 kHz; 500 kHz); 500 kHz or less (e.g., 450 kHz; 350 kHz; 250 kHz; 150 kHz; 50 kHz); or 50 kHz-500 kHz (e.g., 75 kHz; 100 kHz; 125 kHz; 150 kHz; 175 kHz; 200 kHz; 225 kHz; 250 kHz; 275 kHz; 300 kHz; 325 kHz; 350 kHz; 375 kHz; 400 kHz; 425 kHz; 450 kHz; 475 kHz). In one embodiment, selection of the sampling rate depends on the flow rate in the microfluidic channel, which can be 1 µl-100 µl as described here. One of the advantages of selecting a small sampling rate is, for example, a cost reduction of the device of the disclosure.

Another embodiment of the method disclosed here comprises, consists essentially of, or consists of: applying a sample to the device of the disclosure; incorporating at least one magnetic particle to the sample; applying an input voltage of at least a single frequency to the at least two electrodes, thereby generating an electric field; passing the sample from the inlet to the outlet of the microfluidic channel through the electric field; measuring a current signal from each of the at least two electrodes, producing a pulse; detecting the pulse; and a further step of amplifying the current signal.

In one embodiment, the methods of the disclosure can provide a pulse having: an amplitude or an absolute amplitude of 0 V or greater (e.g., 0.2 V; 0.4 V; 0.6 V; 0.8 V); 1 V or less (e.g., 0.9 V; 0.7 V; 0.5 V; 0.3 V; 0.1 V); or 0 V-1 V (e.g., 0.05 V-0.95 V; 0.15 V-0.85 V; 0.25 V-0.75 V); a pulse width of 0.02 ms or greater (e.g., 0.04 ms; 0.06 ms; 0.08 ms; 0.1 ms; 0.12 ms; 0.14 ms; 0.16 ms; 0.18 ms; 0.2 ms; 0.4 ms; 0.6 ms; 0.8 ms; 1 ms; 1.2 ms; 1.4 ms; 1.6 ms; 1.8 ms); 2 ms or less (e.g., 1.9 ms; 1.7 ms; 1.5 ms; 1.3 ms; 1.1 ms; 0.9 ms; 0.7 ms; 0.5 ms; 0.3 ms; 0.1 ms; 0.09 ms; 0.07 ms; 0.05 ms; 0.03 ms); or 0.02 ms-2 ms (e.g., 0.03 ms; 0.05 ms; 0.07 ms; 0.11 ms; 0.13 ms; 0.15 ms; 0.17 ms; 0.19 ms; 0.25 ms; 0.45 ms; 0.65 ms; 0.85 ms; 1.1 ms; 1.3 ms; 1.5 ms; 1.7 ms; 1.9 ms); a rise time of 0.01 ms or greater (e.g., 0.02 ms; 0.04 ms; 0.06 ms; 0.08 ms; 0.1 ms; 0.12 ms; 0.14 ms; 0.16 ms; 0.18 ms; 0.2 ms; 0.4 ms; 0.6 ms; 0.8 ms); 1 ms or less (e.g., 0.9 ms; 0.7 ms; 0.5 ms; 0.3 ms; 0.1 ms; 0.09 ms; 0.07 ms; 0.05 ms; 0.03 ms); or 0.01 ms-2 ms (e.g., 0.03 ms; 0.05 ms; 0.07 ms; 0.11 ms; 0.13 ms; 0.15 ms; 0.17 ms; 0.19 ms; 0.25 ms; 0.45 ms; 0.65 ms; 0.85 ms; 1 ms; 1.1 ms; 1.3 ms; 1.5 ms; 1.7 ms; 1.9 ms); a fall time of 0.01 ms or greater (e.g., 0.02 ms; 0.04 ms; 0.06 ms; 0.08 ms; 0.1 ms; 0.12 ms; 0.14 ms; 0.16 ms; 0.18 ms; 0.2 ms; 0.4 ms; 0.6 ms; 0.8 ms); 1 ms or less (e.g., 0.9 ms; 0.7 ms; 0.5 ms; 0.3 ms; 0.1 ms; 0.09 ms; 0.07 ms; 0.05 ms; 0.03 ms); or 0.01 ms-2 ms (e.g., 0.03 ms; 0.05 ms; 0.07 ms; 0.11 ms; 0.13 ms; 0.15 ms; 0.17 ms; 0.19 ms; 0.25 ms; 0.45 ms; 0.65 ms; 0.85 ms; 1 ms; 1.1 ms; 1.3 ms; 1.5 ms; 1.7 ms; 1.9 ms); a normalized width differential factor (NWDF) of −0.1 or greater (e.g., −0.08; −0.06; −0.04; −0.02; 0; 0.02; 0.04; 0.06; 0.08); +0.1 or less (e.g., 0.09; 0.07; 0.05; 0.03; 0.01; −0.01; −0.03; −0.05; −0.07; −0.09); or −0.1-+0.1 (e.g., −0.09; −0.07; −0.05; −0.03; −0.01; 0 V; +0.02; +0.04; +0.06; +0.08); or combinations of any of the aforementioned parameters.

In another embodiment, the methods of the disclosure compare a sample of interest and a control sample, where the control sample lacks any magnetic particles. For high throughput screening embodiments comprising multiple devices that are on a single substrate (e.g., FIG. 8C, which has 3 separate devices), at least one of the devices can test or run a control sample without any magnetic particles while any of the other devices on the same substrate can test or run one or more samples of interest or experimental samples, i.e., simultaneously run under the same conditions. Accordingly, in yet another embodiment, methods of the disclosure further comprise the step of comparing the results of the control sample and that of the experimental sample(s). Any or all combinations of pulse parameters (e.g., amplitude, a pulse width, a rise time, a fall time, a NWDF) disclosed here as generated by a sample comprising at least one magnetic particle can be less than those pulse parameters generated by a control sample without at least one magnetic particle. In another embodiment of the methods described here, provide a sample comprising cells with at least one magnetic particle that generate pulse parameters of an amplitude, a pulse width, a rise time, a fall time, and a NWDF less than pulse parameters of an amplitude, a pulse width, a rise time, a fall time, and a NWDF of a cell without at least one magnetic particle, i.e., a control sample.

In yet a further embodiment of the disclosure, the methods can detect at least one phagocytic cell in the sample, detect the presence or absence of at least one phagocytic cell; and/or quantify the number of internalized magnetic particles, which correlates to the subject's immune response.

Some embodiments can be directed to point-of-care methods of using devices of the disclosure quantify and evaluate the response of a subject to pathogenic infections. Non-limiting examples of uses of the devices of the disclosure include: early diagnosis; stratification of infected subjects at high-risk; quantification of a subject's cells for phagocytic ability; and determination or monitoring of an effective therapeutic response. One embodiment can be directed to the use of the devices of the disclosure for stratification of subjects infected with a pathogen (e.g., bacteria, virus) in diseases, such as but not limited to, sepsis, COVID-19, AIDS, tuberculosis, and the like.

Figure 18A:
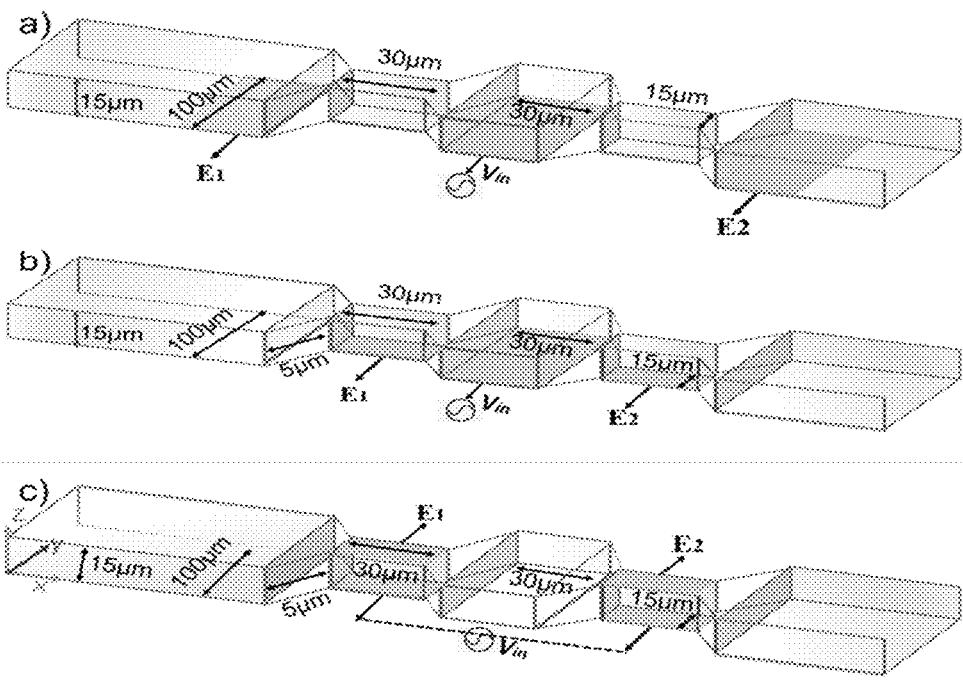
FIG. 18A and FIG. 18B provide exemplary configurations of the electrical and microfluidic subsystems of the device, where the electrodes are identified by dark grey regions where voltage in (Vin) or energy (E1, E2, E3) enters or exits and the microfluidic channel is represented by the light grey in directions of the x-axis, y-axis, and z-axis.
Figure 18B:
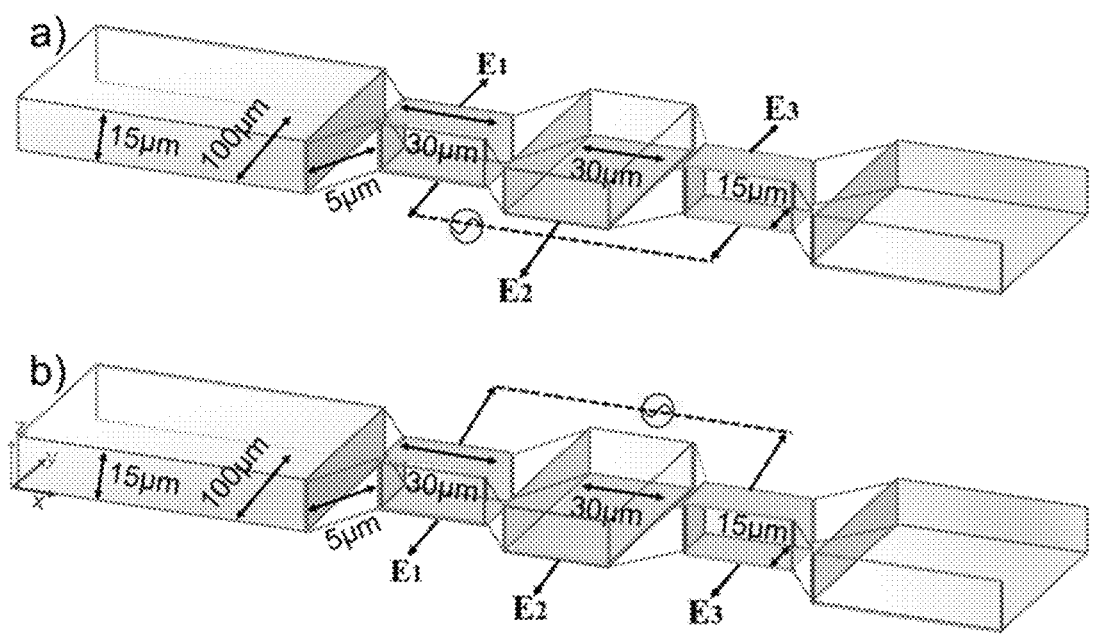
Figure 18C:
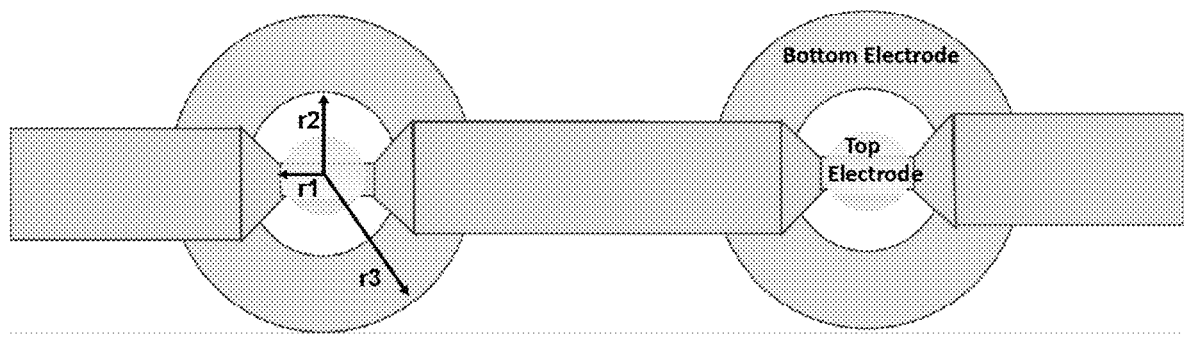
FIG. 18C illustrates another exemplary configuration where the electrodes have a circular or ring shape and are coplanar, where a microfluidic channel is parallel to the electrodes and positioned in between the top electrode and the bottom electrode. The top electrode has a radius, r1; the bottom electrode has an inner radius, r2, and an outer radius, r3.

Some embodiments provide various configurations of the electrical and microfluidic subsystems of the device of the disclosure as used in the methods of the disclosure. In a region or portion of the configurations of FIG. 18A, FIG. 18B, and FIG. 18C, the subsystems can include 3-5 coplanar electrodes and varying microfluidic channel widths and placement of the electrodes.

Applications

In one embodiment, the sensor and methods of the disclosure can be applied as a point-of-care diagnostic device for clinical settings. Clinicians can use sensors of the disclosure to perform diagnostic biological measurements at the time and location at which the subject is receiving care. Some embodiments can be directed to a single-use, disposable sensor. Other embodiments of the disclosure provide sensors that can be used multiple times, i.e., 1 or more times (e.g., 2, 3, 4, 5) with thorough cleanings in between uses or testing different samples to avoid any cross-contamination, inaccurate results, or detection errors among the tested samples.

Another embodiment can provide a device and methods for quantifying and characterizing the phagocytic ability of cells of a subject, such as those suffering from a pathogenic infection based on a correlation between a subject's immune response to infection and phagocytic ability of the subject's cells. Phagocytosis occurs when phagocytes (e.g., white blood cells, neutrophils, monocytes, macrophages, mast cells, dendritic cells) engulf pathogens to fight the disease or condition caused by the pathogenic infection. Analyzing the cells of a subject suffering from a pathogenic infection provides insight as to the onset of sepsis, its progression, and treatment.

Figure 19:
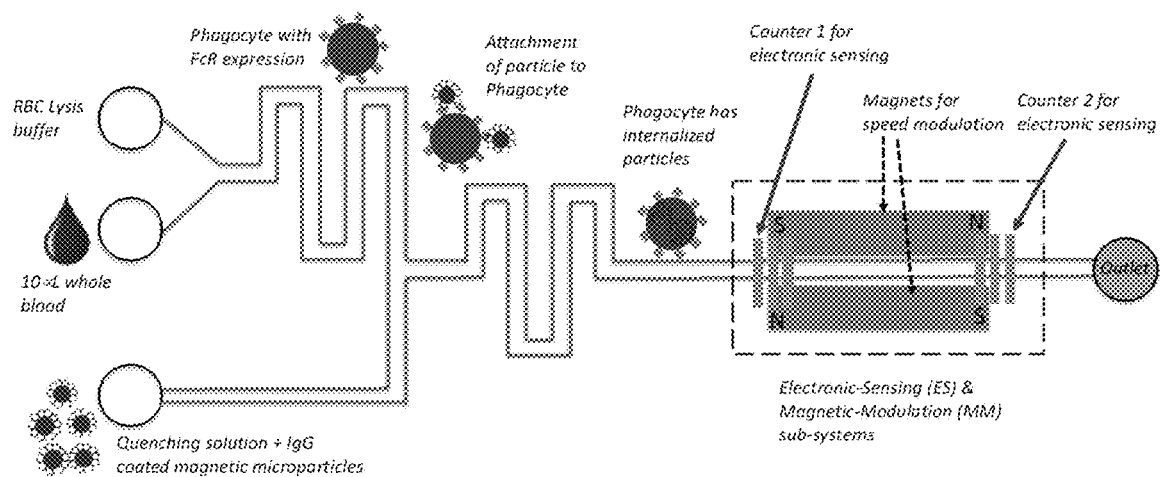
FIG. 19 presents an exemplary schematic of an integrated biochip to quantify the phagocytic ability of blood cells as described by the disclosure.

A further embodiment can be directed to an integrated biochip (FIG. 19) where a biological sample can be processed and tested on the biochip. Briefly, Fcγ receptor-mediated phagocytosis can occur when Fcγ receptors (e.g., FcγRI, FcγRIIB, FcγRIII, FcγIV) on the surface of phagocytes, such as but not limited to, monocytes, macrophages, or neutrophils, can bind with immunoglobulin G antibodies (IgGs) through their Fc regions, particularly at the Fc receptor binding site, which causes phagocytosis of IgGs including those bound to pathogens (e.g., viruses, bacteria, fungi). For example, a sample of whole blood (e.g., 10 µl) and a red blood cell (RBC) lysis buffer can be applied to an inlet of a microfluidic channel of the biochip for an amount of time sufficient to lyse the red blood cells and expose phagocytes expressing Fc receptors on the surface of the cells. In another inlet, a lysis quenching solution and immunoglobulin G (IgG) coated magnetic microparticles that recognize the Fc receptors (FcRs) on phagocytes are applied. The two microfluidic channels join to combine the phagocytes and magnetic microparticles for a sufficient period of time to enable attachment of the microparticles to the phagocytes and internalization of microparticles within the phagocytes. The sample and reagents flow through the microfluidic channels of the device from the inlet to the outlet passing through one set of electrodes at in a magnetic field created by two magnets independently disposed or configured to be disposed in parallel and adjacent to the microfluidic channel or portion thereof. The sample first passes through counter 1 for electronic sensing and then passes through counter 2 for electronic sensing before exiting through the outlet of the device. The phagocytes with internalized magnetic particles pass through electric and magnetic fields of the electronic-sensing (ES) and magnetic-modulation (MM) subsystems of the device, where the magnets modulate the speed.

In a similar application, the biochip device and associated methods described here can also be applied to complement receptor-mediated phagocytosis. Some embodiments of the disclosure can be applied to this type of phagocytosis, where phagocytes express complement receptors (CR) (e.g., CR1, CR3 (e.g., integrin αMβ2, i.e., CD11b/CD18), CR4, (e.g., integrin αXβ2, i.e., CD11c/CD18)) and complement proteins, such as C3b, C3bi, or C4b, which recognize the complement receptors on the surface of, for example, phagocytes (e.g., white blood cells, neutrophils, monocytes, macrophages, mast cells, dendritic cells). These complement proteins are opsonins can be found on pathogens. In some embodiments, the phagocytes expressing complement receptors (e.g., C3b receptor) can bind to complement proteins (e.g., C3bi)-coated magnetic microparticles that recognize the complement receptors. Briefly, magnetic beads conjugated to complement components or proteins can bind to phagocyte-expressing complement receptors as used in the disclosed device or sensor described here. For example, a sample of whole blood (e.g., 10 µl) and a red blood cell (RBC) lysis buffer can be applied to an inlet of a microfluidic channel of the biochip described here for an amount of time sufficient to lyse the red blood cells and expose phagocytes expressing complement receptors on the surface of the cells. In another inlet, a lysis quenching solution and complement protein (C3bi)-coated magnetic microparticles that recognize the complement receptors (CRs), such as CR3, on phagocytes are applied. The two microfluidic channels join to combine the phagocytes and magnetic microparticles for a sufficient period of time to enable attachment of the microparticles to the phagocytes and internalization of microparticles within the phagocytes. The sample and reagents flow through the microfluidic channels of the device from the inlet to the outlet passing through one set of electrodes at in a magnetic field created by two magnets independently disposed or arranged in parallel and adjacent to the microfluidic channel or portion thereof. The sample first passes through counter 1 for electronic sensing and then passes through counter 2 for electronic sensing before exiting through the outlet of the device. The phagocytes with internalized magnetic particles pass through electric and magnetic fields of the electronic-sensing (ES) and magnetic-modulation (MM) subsystems of the device, where the magnets modulate the speed.

In some embodiments, the methods of the disclosure can be performed using pathogens or microbes for analysis, opsonizing them or incubating the pathogens or microbes with, for example, IgG or C3bi proteins, where the IgG or C3bi proteins recognize their respective receptors, i.e., Fcγ receptor or complement receptor, respectively, on phagocytes in devices of the disclosure, where the ES and MM subsystems of the device are applied.

Machine Learning

Briefly, machine learning provides classification Some embodiments of the disclosure provide a unique machine learning (ML) model to train and predict an outcome based on different data classification modeling techniques. The artificial neural network classification technique described here can be used to predict activity for, for example, positive phagocytosis versus negative phagocytosis. Similarly, other unique ML prediction models using data generated by any one of the devices described here, employing supervised classification techniques, such as but not limited to logistic regression, support vector machines, Naive Bayes, Decision Tree, and Random Forest, are encompassed by the disclosure. Exemplary classification methods useful in the unique ML models described here are discussed in, for example, Suthaharan, Shan. "Machine Learning Models and Algorithms for Big Data Classification: Thinking with Examples for Effective Learning." Vol. 36, Springer, 2016, which is incorporated by reference.

Advantages of using the device of the disclosure as a point-of-care diagnostic include, for example, the short processing time, small sample volume, low cost, and portability, all of which allow for a one-time-use or disposable device. In other embodiments, any of the devices of the disclosure can be re-used multiple times, i.e., 1 or more times (e.g., 2, 3, 4, 5) after thoroughly cleaning the device in between uses or testing different samples to avoid any cross-contamination, inaccurate results, or detection errors. The sensing mechanism can require 1 mL or less of sample and utilize two hours or less to process, collect data, and analyze the data. In one embodiment, the device of the disclosure can be used for high-throughput diagnostic screening as described here, for example, diagnoses, phagocytosis, monitoring treatments, and the like.

Some embodiments of the disclosure provide for devices and methods of the disclosure for quantifying phagocytic activity in, for example, a septic subject, or for diagnosing sepsis in a subject, or in a subject demonstrating symptoms of sepsis. In additional embodiments, the disclosure provides an electrical counting system paired with the devices and methods described here.

EXAMPLES

The following examples illustrate specific aspects of the instant description. The examples should not be construed as limiting, as the example merely provides specific understanding and practice of the embodiments and its various aspects.

Example 1

Electrical Simulations

Figure 4A:
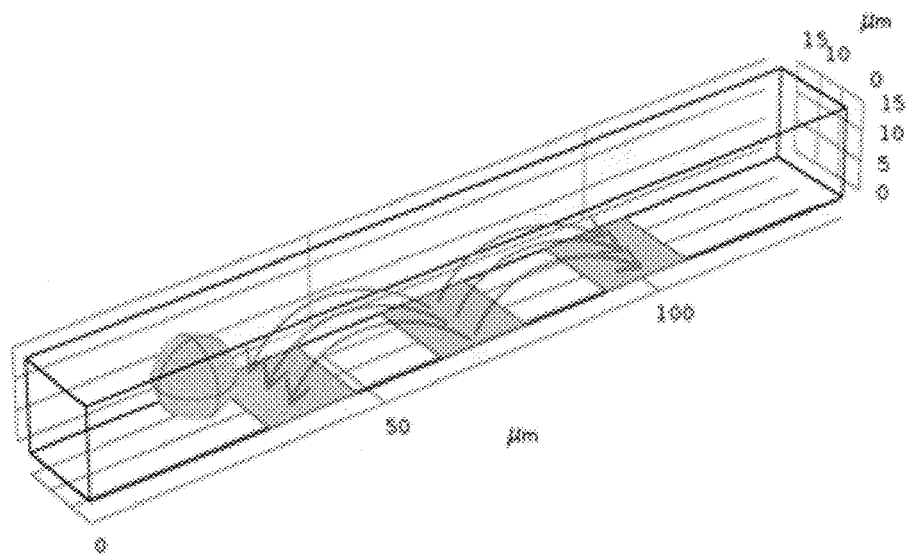
FIG. 4A presents an exemplary model of a microfluidic channel illustrating coplanar electrodes.

A model of a microfluidic channel was created with a width of 15 µm and a height of 15 µm as shown in FIG. 4A. Three 15 µm by 15 µm coplanar electrodes were located at the bottom of this microfluidic channel with inter-electrode spacing of 15 µm. This model was used to simulate the microfluidic and electrical subsystems, and more specifically the impedimetric sensor. In this model, the channel was filled with a conductive fluid with relative permittivity of 80 that was intended to mimic the phosphate-buffered saline solution in which the phagocytes will be suspended in the biosensor. Additionally, a sphere with a diameter of 12 µm and a relative permittivity of 150.9 was located in the channel to mimic a phagocyte, such as a neutrophil.

Figure 4B:
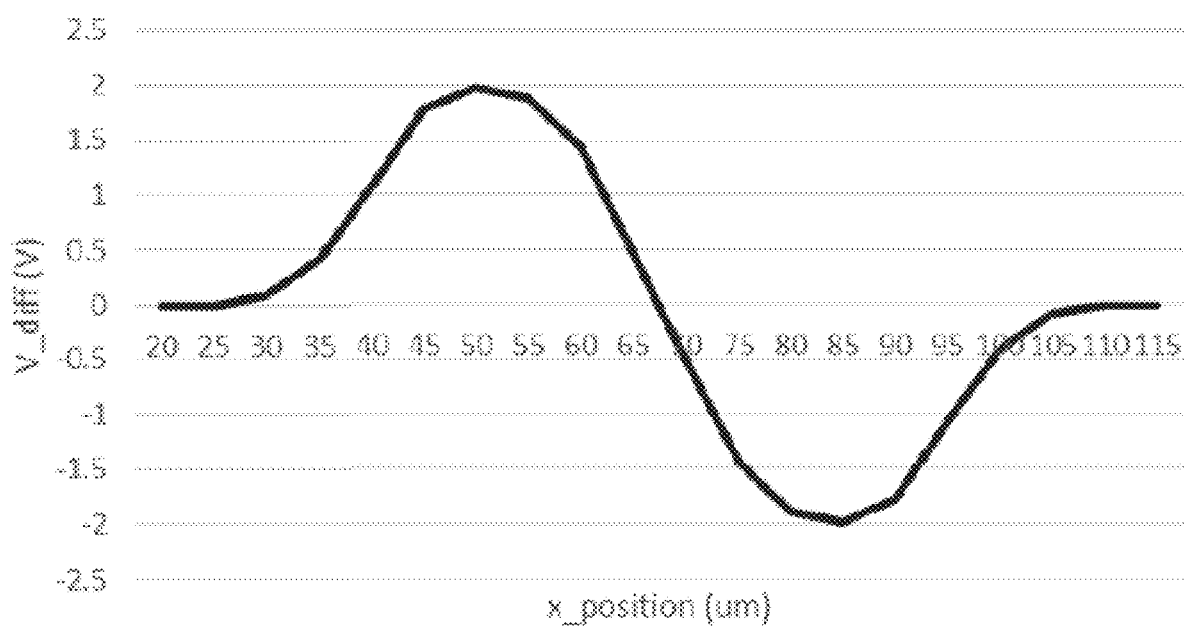
FIG. 4B shows a simulated electrical signature of a single phagocytic cell (without magnetic particles) flowing through a sensing region.

Using this model, a simulation was performed to mimic the flowing of a neutrophil through the sensing region. To do this, the location of the sphere representing the neutrophil was parameterized and swept through the sensing region in 5 µm increments. During this time, a 5V 300 kHz AC voltage signal was applied to the middle electrode and the voltage was measured at each of the outer two electrodes. The two voltages were subtracted, and the differential voltage was plotted across all swept phagocyte locations to receive the bipolar pulse described earlier in this chapter. The results of this simulation are shown in FIG. 4B.

Example 2

Magnetic Field Simulations

Figure 5A:
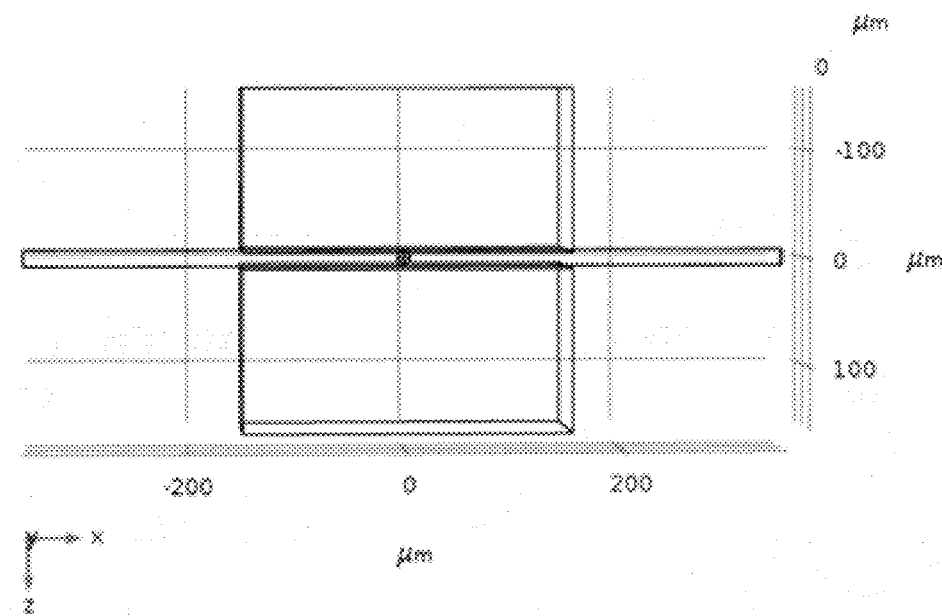
FIG. 5A illustrates a magnetic field model created with two permanent magnets of opposite polarities on either side of a linear microfluidic channel
Figure 5B:
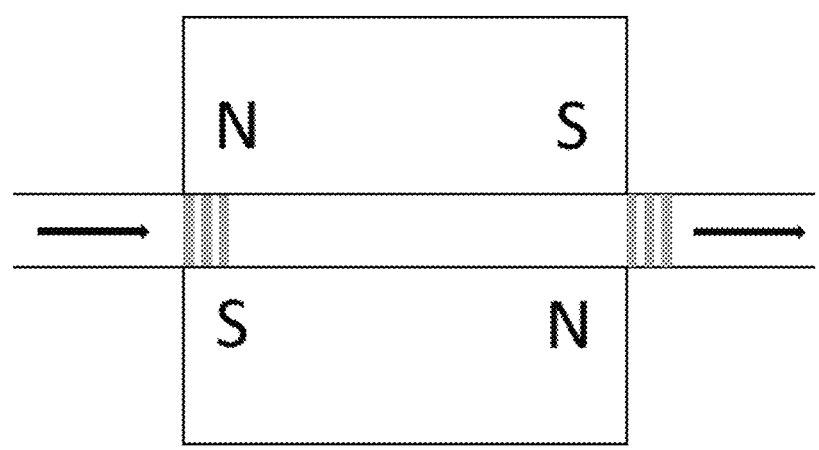
FIG. 5B presents a diagram of a magnetic quantification framework where a biological sample flows through a counting region comprised of three coplanar electrodes and two permanent magnets with opposite polarities.

In order to simulate the magnetic field generated by the magnetic subsystem, a model was created with two permanent magnets of opposite polarities on either side of a linear microfluidic channel as shown in FIG. 5A. For this simulation, the same microfluidic channel and conductive fluid used during the electrical simulations were used again. The magnets on either side of the channel have a width of 300 µm, a height of 150 and a depth of 150 µm and are meant to represent a section of a larger magnet. For this simulation, the profile of the magnetic field was more useful than its value, so the magnetization of each permanent magnet was selected to be 31.5 MA/m in order to approximately match the magnetization of the commercially available permanent magnets. The magnetic field profile matched the expected profile of a quadrupole configuration such as that shown in FIG. 5B.

Example 3

Magnetic Force Simulations

Figure 6A:
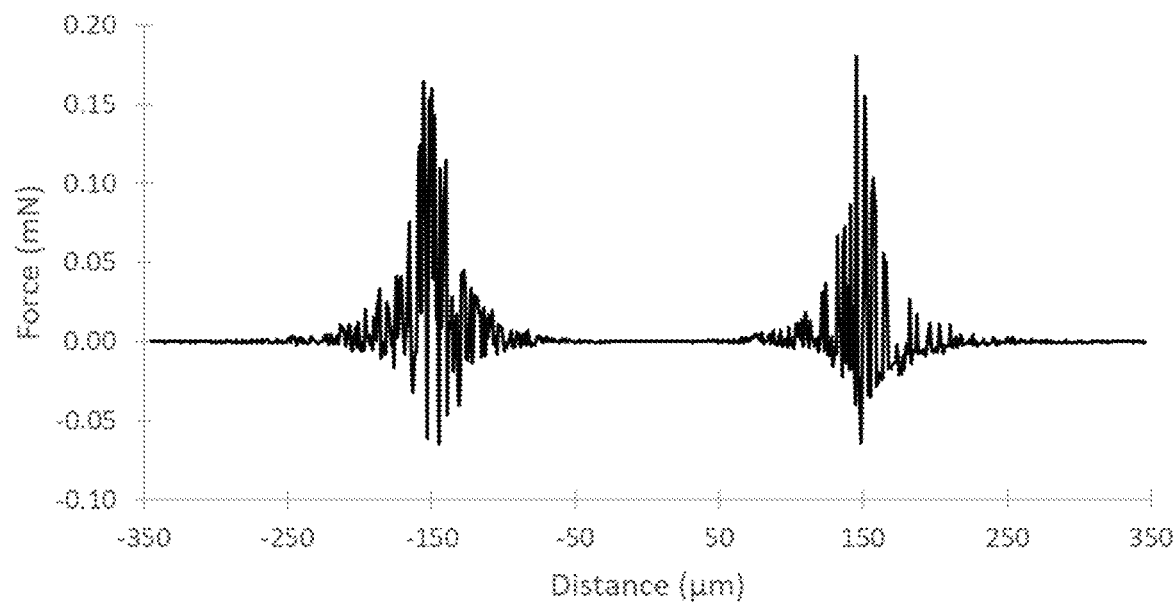
FIG. 6A illustrates a magnetic force acting on a cell with one ingested magnetic particle in a configuration comprising two magnets with fields parallel to the flow of a microfluidic channel and of opposite polarities, where a bimodal force on the microparticle occurs as it enters and exits the magnetic field.

A sphere with a diameter of 12 µm was introduced to the magnetic field simulations from Example 2 in order to simulate a phagocyte, such as a neutrophil. Additionally, a smaller sphere with a diameter of 1 µm was added inside the neutrophil sphere to simulate a phagocytosed ferromagnetic microparticle. The location of the neutrophil and its internalized microparticle was parameterized and swept across the length of the channel in 1 µm increments. At each increment, the magnetic force acting on the microparticle by the permanent magnetic field was recorded and plotted as shown in FIG. 6A. The quadrupole magnetic field configuration enacted a strong magnetic force on the microparticle, and by extension on the neutrophil, only at the edges of the permanent magnets and very little magnetic force elsewhere in the channel.

Figure 6B:
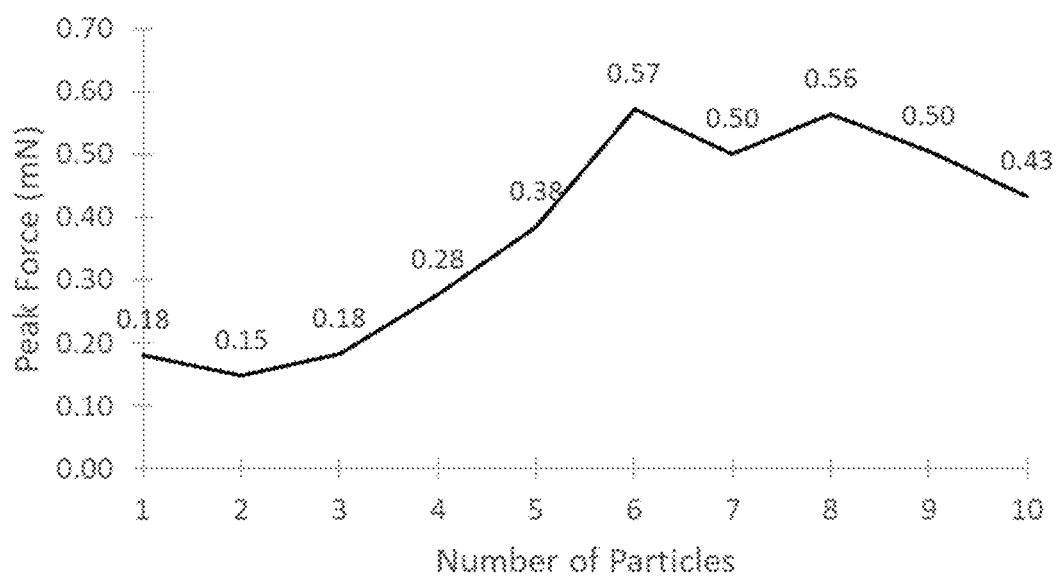
FIG. 6B shows peak magnetic force as a function of the number of internalized microparticles.

This process was repeated for different quantities of internalized microparticles from 1 to 10 and the peak magnetic force was recorded each time. The results of this study are shown in FIG. 6B. The peak magnetic force acting on the phagocyte generally increased with the number of internalized particles. The fact that the force did not increase at every increment could be explained by the fact that each particle exists at a different location in the phagocyte and is therefore acted upon by the magnetic field at slightly different increments along the channel. For instance, a particle at the front of the cell will pass the edge of the magnets before a particle at the back of the cell. This can result in two different particles pulling the same cell in opposite directions. Therefore, depending on the orientation of the particles within the cell, the peak magnetic force can not always increase with an increasing number of internalized particles even though this is true as a general trend.

Figure 6C:
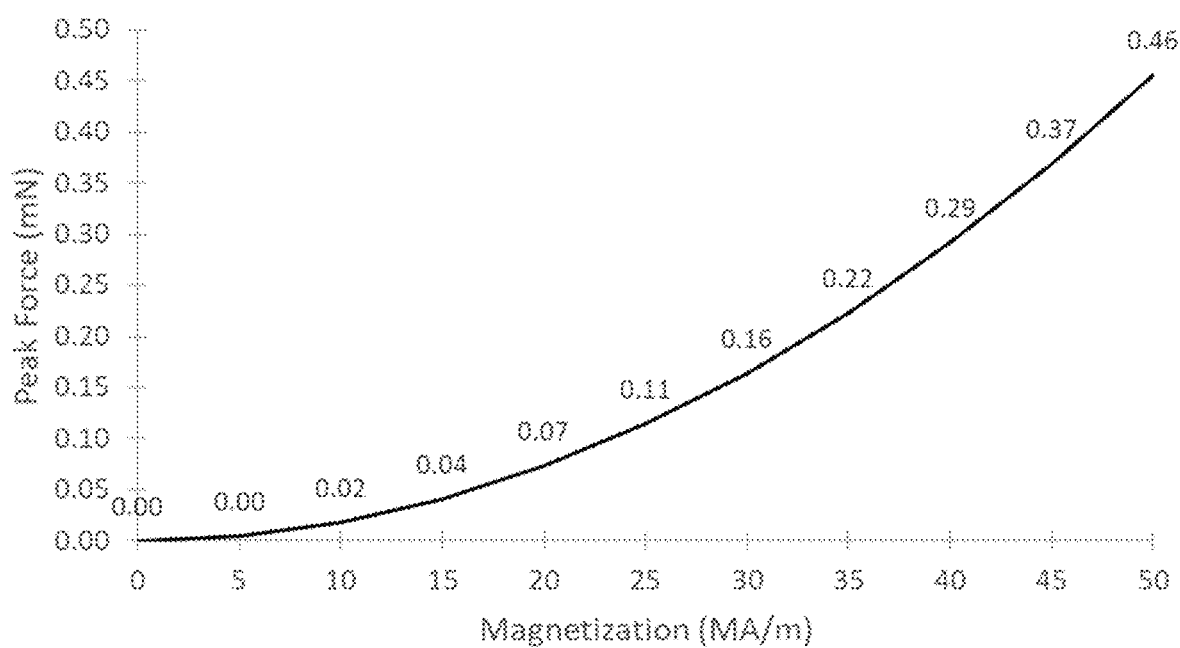
FIG. 6C demonstrates increased peak magnetic force acting on a phagocytic cell with a single internalized magnetic particle as a function of increasing magnetization of permanent magnets used to form the quadrupole magnetic field.

In addition to the number of internalized microparticles, the magnetization of the permanent magnets was parameterized. This property was swept from 0 to 50 MA/m in 5 MA/m increments while keeping the number of internalized microparticles at a constant 1 and the peak magnetic force was recorded for each step. The results of this study are shown in FIG. 6C. The peak magnetic force acting on a phagocyte with a single internalized ferromagnetic microparticle increased with increasing magnetization of the permanent magnets used to form the quadrupole magnetic field. The results showed a very clear exponential relationship between the magnetization of the permanent magnets and the peak magnetic force acting on the phagocyte. This is useful, because it allowed for well-defined control over the magnetic force in the final design by changing the strength of the magnets used.

Example 4

Microfluidic Channel Fabrication

Figure 7A:
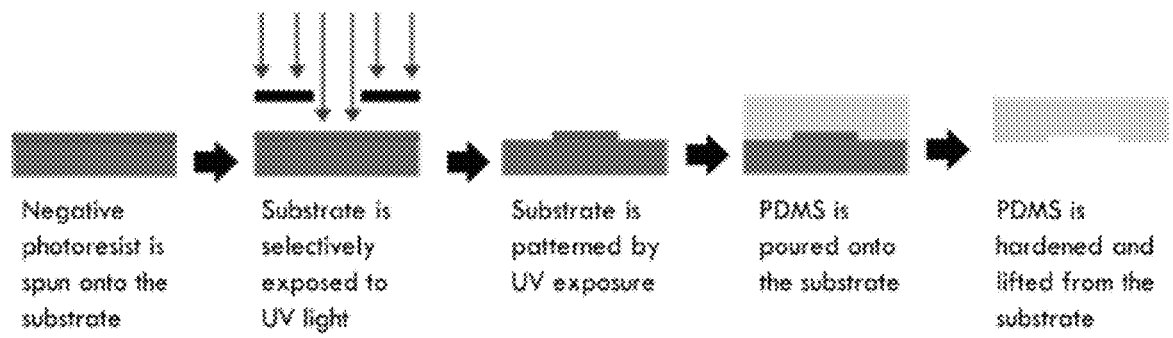
FIG. 7A presents a microfluidic subsystem fabrication process.

The microfluidic subsystem of this device was fabricated using a combination of traditional photolithographic and soft lithographic microfabrication techniques. To begin, a master mold is fabricated on a silicon substrate. This mold is then used to repeatedly fabricate microfluidic devices made of a silicone elastomer called polydimethylsiloxane (PDMS). These fabrication processes are explained in detail below but can also be seen in a simplified manner in FIG. 7A.

Master Mold Lithography

Before the master mold fabrication began, the silicon wafer that would serve as a substrate was thoroughly cleaned and prepared for lithography by consecutively soaking it in baths of acetone, isopropyl alcohol, and de-ionized water for 10 minutes each, drying it with compressed nitrogen gas, and baking the wafer for 30 minutes at 150° C. After the wafer was cleaned, baked, and allowed to cool for an additional five minutes, SU-8 2025 negative photoresist was spin-coated onto the wafer to provide an even layer across the surface. Then, the wafer was baked for 5 minutes at 65° C. and 60 minutes at 95° C. consecutively.

At this point, the portions of SU-8 that had been exposed to ultraviolet radiation became insoluble and the unexposed regions became more soluble. The wafer was submerged in an SU-8 developer solution and allowed to develop on a shaker plate for approximately 20 minutes, which dissolved the soluble un-exposed regions of the photoresist and left only photoresist in the regions where the microfluidic channels were desired. The wafer was then rinsed with de-ionized water and dried with compressed nitrogen gas. Finally, the wafer was placed in a desiccator under vacuum along with 20 μL of trichlorosilane to form a silane layer overtop that acts as a coupling layer between the silicon substrate and the PDMS used in the next fabrication process.

PDMS Soft Lithography

Once the master mold was fully fabricated, soft lithography techniques were used to fabricate the microfluidic devices. First, the PDMS elastomer base and its activator were combined in a 10:1 ratio and manually mixed until a viscous homogeneous solution is formed. Then, homogeneous elastomer solution was poured over the master mold in a petri dish until it covered the wafer with the desired thickness. In order to remove any bubbles that can have formed during the mixing and pouring process, the entire petri dish was desiccated under vacuum for 1 hour. Once all bubbles were removed from the PDMS solution, the wafer was baked overnight at 65° C. to polymerize and solidify.

Once the PDMS was molded into the silicon master mold, the 8 individual microfluidic devices were individually cut out from the master mold using a scalpel. Inlet and outlet holes were carefully formed at either end of the linear channel using a biopsy needle. At this point, the microfluidic subsystem fabrication was complete.

Example 5

Electrode Fabrication

Figure 7B:
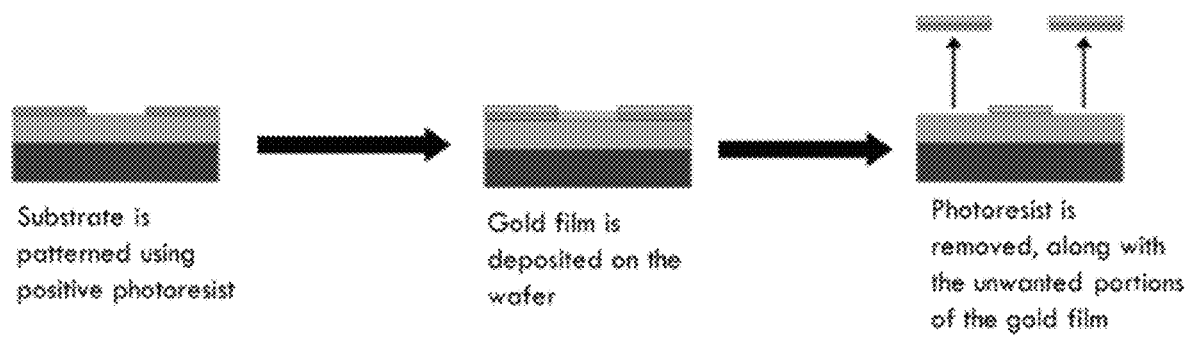
FIG. 7B shows an electrical subsystem fabrication process.

The electrical subsystem of this device was also fabricated using traditional photolithographic microfabrication techniques, this time for patterning gold on a glass substrate. These fabrication processes are explained in detail below and illustrated in a simplified manner in FIG. 7B. For this process, the glass wafer was cleaned and baked according to the same process as that was used for the silicon wafer during the microfluidic master mold fabrication. After cleaning, baking, and cooling, the glass wafer was spin-coated once with hexamethyldisilazane (HMDS) and then again with Shipley S1818 positive photoresist. The HMDS here acted as an adhesion promoter between the glass substrate and the Shipley photoresist. The wafer was then baked for 4 minutes at 120° C.

At this point, another photomask was used to pattern the electrodes into the photoresist using ultraviolet light. Similarly, to the mask used for the microfluidic master mold, this photomask was designed to pattern 8 sets of electrodes on a single glass wafer. The photomask was cleaned according to the same protocol used during the microfluidic master mold fabrication and the glass wafer was selectively exposed to ultraviolet radiation with a dose of 350 mJ/cm$^2$. This time, only the regions exposed to the ultraviolet radiation became soluble, and all other regions remained insoluble. No post-exposure bake was required for this photoresist. The wafer was submerged in MF-319 developer solution and allowed to develop on a shaker plate for 20 minutes, which now dissolved the photoresist only in the regions where the electrodes were desired. Again, the wafer was rinsed with de-ionized water and dried with compressed nitrogen gas after development. Oxygen plasma was also used to descum the wafer after development as an additional cleaning step to remove photoresist residue.

Figure 7C:
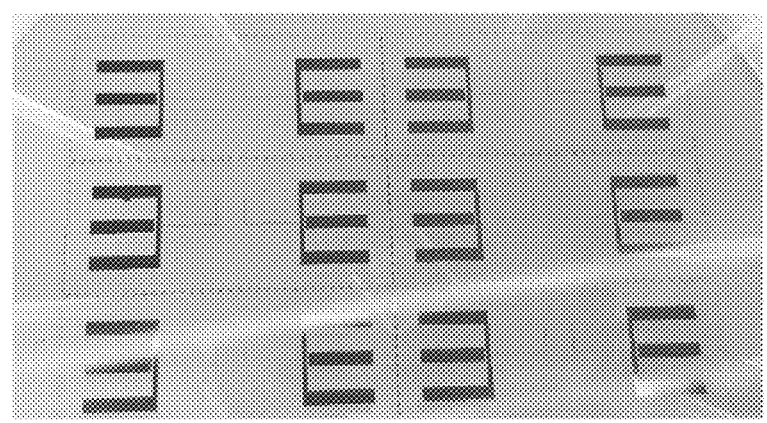
FIG. 7C illustrates an image of fabricated gold electrodes.

Before depositing the gold onto the wafer, the exposed regions of the glass wafer were etched to ensure a flush edge between the glass substrate and the gold electrodes. To perform this etching, the wafer was soaked in hydrofluoric acid for 5 minutes and then thoroughly rinsed with de-ionized water. During this process, the remaining photoresist protected the glass underneath it from being etched, so only the glass in the locations of the desired electrodes was etched. After etching, a 10 nm layer of chromium was sputtered onto the glass substrate, followed by a 100 nm layer of gold. Gold was used to fabricate the electrodes because it was inert and resistant to corrosion, and chromium was used to improve the adhesion between the gold and the glass substrate. At this point the remaining photoresist, along with the gold layer above it, was lifted-off from the glass wafer using acetone and the wafer was cleaned using isopropyl alcohol, de-ionized water, and compressed nitrogen gas. All that remained on the glass wafer was gold in the regions where the electrodes were desired as shown in FIG. 7C, and the 8 individual sets of electrodes were separated using a dicing saw.

Example 6

Subsystem Integration

Figure 8A:
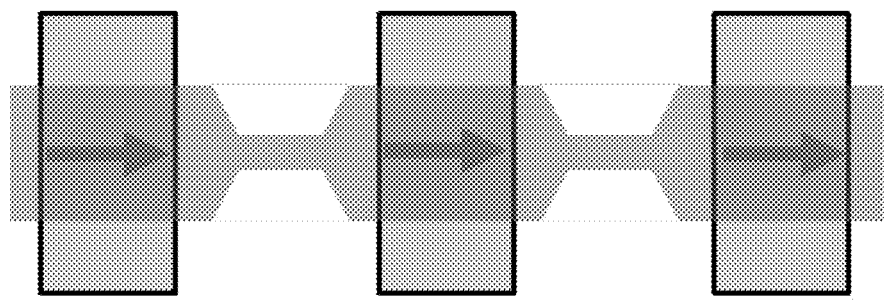
FIG. 8A presents an exemplary alignment of microfluidic and electrical subsystems where focusing regions lie between the electrodes and the direction of sample flow is represented by the arrows.
Figure 8B:
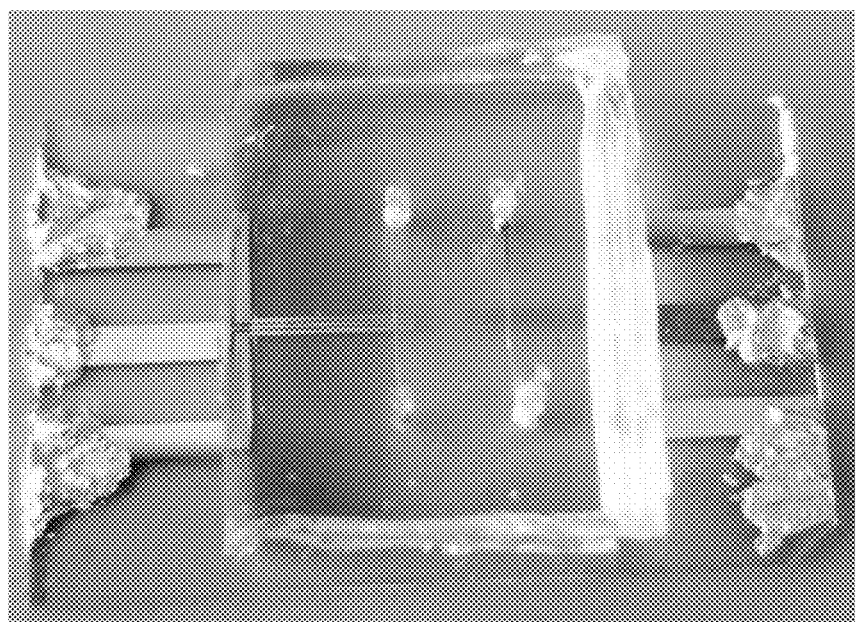
FIG. 8B provides an image of covalently bonded electrical and microfluidic subsystems.
Figure 8C:
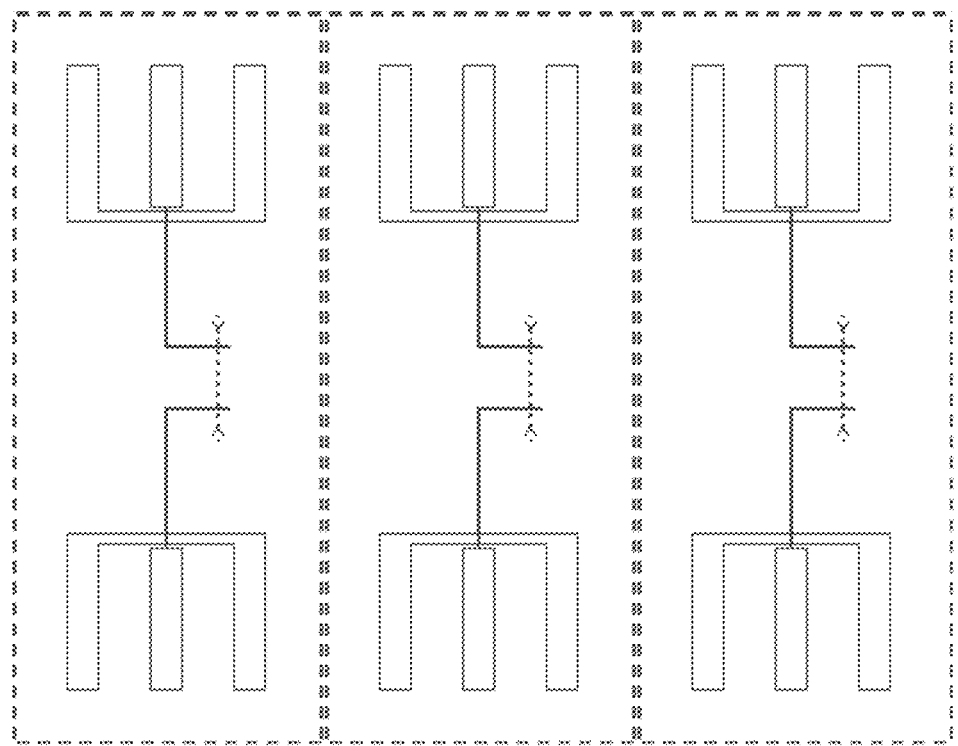
FIG. 8C illustrates an exemplary line drawing of electrical (solid lines) and microfluidic (dotted lines) subsystems for three separate devices. The boundary (dashed lines) represents the region to dice the wafer into multiple devices.

Once both the electrical and microfluidic subsystems had been individually fabricated, they were ready to be combined along with the magnetic subsystem to form the complete biosensor framework or device. To do this, the PDMS microfluidic devices were chemically bonded to the glass substrate of the electrodes. However, both subsystems were thoroughly cleaned prior to bonding to ensure the channel maintained an airtight seal. Both subsystems were submerged in ethanol and sonicated for 20 minutes to remove any debris. They were then rinsed in de-ionized water and dried with compressed nitrogen gas. Once sufficiently cleaned, both subsystems were exposed to oxygen plasma, carefully aligned to each other so that the focusing regions lay between the electrodes as shown in FIG. 8A and left to cure overnight. The oxygen plasma here facilitated covalent bonding between the PDMS of the microfluidic subsystem and the glass substrate of the electrical subsystem. It is important to recognize that a misalignment of the microfluidic channel during this step would result in a reduction of the SNR experienced by the system. At this point, the microfluidic and electrical subsystems were fully integrated as shown in FIG. 8B where the electrical and microfluidic subsystems are covalently bonded and the CAD drawing of FIG. 8C, where the electrical subsystem (solid lines) illustrated by the "E" shaped electrodes connected to the microfluidic subsystem (dotted lines) shown for three separate devices with dashed lines illustrating the boundaries among the separate devices.

Integration of the magnetic subsystem was very simple at this point, as the inherent magnetic attraction between the two permanent magnets on either side of the microfluidic channel held them in place once properly aligned. The magnetic field generated by these magnets would only be strong in a very limited volume of the channel as shown in a simulated quadrupole magnetic field of the configuration of FIG. 5B, so it was critical at this point to ensure that the edges of the permanent magnets were aligned just upstream of the sensing region. Misalignment at this point would result in a less distinct change in the electrical footprint of phagocytes with internalized particles and would therefore produce a sensor with poor sensitivity. If desired, extra steps could be taken to immobilize the permanent magnets once properly aligned.

Although the biosensor was considered a complete package at this point, several additional steps were taken to more readily facilitate data collection. The electrodes were electrically bonded to a printed circuit board (PCB) via silver conductive epoxy. To achieve this, the two parts of the epoxy were combined in a 1:1 ratio and manually mixed until homogeneous. The epoxy was then applied to the electrodes and the PCB to form an electrically conductive bridge at each electrode. The epoxy was then cured for 20 minutes at 65° C. This PCB served as a fanout board to individually access the electrodes in the biosensor. The PCB then connected to a simple stripboard that was designed to couple the three electrodes with the measurement equipment via BNC connectors and current limiting-resistors.

Example 7

Biological Sample Preparation

De-identified biological samples for device testing were obtained from the blood pathology lab at Robert Wood Johnson University Hospital. The procured samples were whole blood samples drawn from patients suspected of sepsis. They were originally sent to the pathology lab to undergo serum lactate testing, and the concentration of serum lactate in each sample was recorded upon receipt of the samples. All biological samples were processed and analyzed within 8 hours of hospital pickup.
Neutrophil Isolation For this study, neutrophils, the most abundant phagocytes present in an infected patient, were the desired analyte and were isolated from each biological sample. A thorough isolation protocol was developed to achieve this by removing the majority of non-desired cells from the sample. To begin, the whole blood samples were diluted by 50% with 1× phosphate buffered saline (PBS), which is a buffer solution used to match the pH and osmolarity normally found in the human body. At this point, each of the following steps were performed in triplicate for each individual sample. The diluted whole blood samples (0.8 mL) were carefully layered on top of 0.6 mL of Ficoll Paque density gradient as illustrated by the diluted whole blood layer on top of the density gradient layer, and the samples were centrifuged at a centrifugal acceleration of 400 g (approximately 3,920 m/s$^2$) for 25 minutes. The density gradient had a density that was greater than that of platelets, lymphocytes, and monocytes, but less than that of granulocytes and erythrocytes. Because of this, the samples were segregated into three distinct volumes after centrifugation. Here the platelets, lymphocytes, and monocytes appeared as a yellowish liquid forming the top layer, the density gradient appeared as a clear liquid forming the middle layer, and the granulocytes and erythrocytes appeared as a viscous deep red liquid forming the bottom layer. The cells of interest were part of the granulocyte population in the lower volume or layer of the sample, so the top two volumes or layers were removed and discarded at this point.

At this point, the remaining volume of each sample contained two distinct populations: granulocytes and erythrocytes. The neutrophils that were the desired analyte for this study were contained in the granulocyte population, so the erythrocytes were removed. Because erythrocytes are generally more sensitive to changes in tonicity, they were selectively lysed while leaving the majority of the granulocytes intact. To do this, 1 mL of de-ionized water was mixed into the sample, providing a hypotonic environment in which the erythrocytes were quickly lysed. After approximately 20 seconds, 0.1 mL of 10× PBS was mixed into the sample. 10× PBS was a buffer solution with a salt concentration 10 times higher than that of 1× PBS, so this restored the tonicity of the sample to its normal levels and quenched the lysing process. The sample was then centrifuged again at a centrifugal acceleration of 300 g (approximately 2,840 m/s$^2$) for 5 minutes to aggregate the granulocytes at bottom of the sample. This lysing process could be repeated several times in order to fully lyse the erythrocyte population. Once the majority of the erythrocytes were lysed, any remaining debris was discarded, and the remaining granulocytes were suspended in RPMI 1640 cell growth medium. Although this population contained neutrophils, basophils, and eosinophils, neutrophils are generally present in the body in a much higher quantity than the other two cell types, so the final sample population was assumed to contain mostly neutrophils.

Microparticle Internalization

At this point, one portion of the neutrophils from each sample was used for a fluorescent assay, another portion was introduced to the opsonized ferromagnetic microparticles to serve as the experimental population for biosensor data collection, and the rest of the neutrophils were set aside to serve as the control population for biosensor data collection. The experimental population of each sample was divided into 3 wells of a 24-well plate such that approximately 200,000 cells were present in each well suspended in 0.5 mL of RPMI. In order to achieve this, the concentration of the population was first manually counted using a hemocytometer. AbraMag anti-human IgG coated magnetic beads were introduced to each well containing neutrophils from the experimental population in a target-to-effector ratio of 25:1. The neutrophils and opsonized ferromagnetic microparticles were allowed to incubate for 40 minutes at 37° C. Any excess ferromagnetic particles that had not phagocytosed were removed from the wells and discarded. The experimental population was removed from the wells and suspended in 0.5 mL of 1× PBS to be tested.

Example 8

Fluorescent Assay

Due to the size of the ferromagnetic microparticles, it was not possible to visually observe their presence inside the cells of the experimental population using the optical microscopy tools available. Therefore, in order to provide confirmation that these particles had in fact been internalized by phagocytes, such as the neutrophils described here, a fluorescent assay was performed on a portion of the neutrophils from each sample. For this phagocytosis verification population, the cells were introduced to opsonized fluorescent microparticles instead of ferromagnetic ones. These fluorescent particles were of similar size to the ferromagnetic particles and coated in the same ligand. Therefore, if the cells of a particular sample had internalized these fluorescent particles, it was reasonably assumed that that the cells would also have internalized the ferromagnetic particles when incubated simultaneously under the same conditions.

In order to perform this assay, the phagocytosis verification population of the sample was also divided into 3 wells of the 24-well plate such that 200,000 cells were present in each well suspended in 0.5 mL of RPMI. SPHERO anti-Human IgG coated fluorescent yellow particles were introduced to each well containing neutrophils from the phagocytosis verification population in the same target-to-effector ratio as was used for the ferromagnetic particles. Additionally, 2.5 µL of CellBrite cytoplasmic membrane dye was added to each well of neutrophils from the phagocytosis verification population. If desired, a nuclear membrane stain was also added at this point. These cells were then incubated simultaneously with the experimental population for 40 minutes at 37° C. Any excess fluorescent particles that were not phagocytosed were removed from the wells and discarded.

After incubation, the wells containing phagocytosis verification population were imaged using fluorescent microscopy. During this process, excitation wavelengths were emitted that excited the internalized fluorescent particles and the membrane dye(s). The particles and the dye(s) then each emitted another wavelength that was captured by a fluorescent microscope. The images containing each emission wavelength were overlaid on top of each other to determine how many microparticles each cell imaged internalized.

Example 9

Electrical Signal Detection

Figure 9:
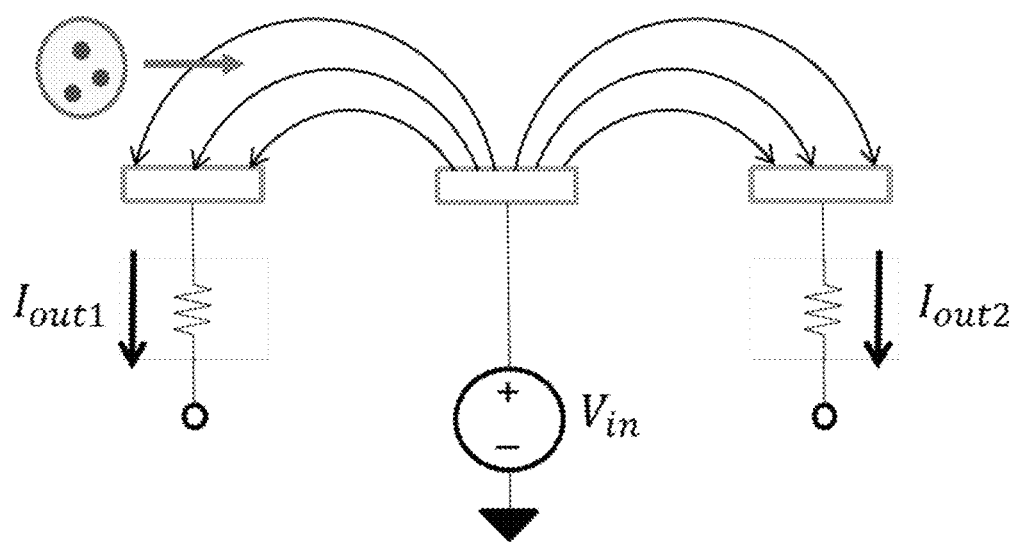
FIG. 9 shows an exemplary coplanar electrode microcytometer diagram. An AC voltage signal (Vin) applied to the middle electrode, generating an electric field between the middle electrode and each of the two outer electrodes. This results in a current signal from each of the two outer electrodes as a cell comprising magnetic microparticles passes through the channel in the direction of the arrow producing an impedance between the center electrode and the corresponding outer electrodes ($I_{out1}$; $I_{out2}$), which manifests as a pulse.

The electrical signature associated with each cell that passed through the sensing region of the device was recorded by processing the information gathered by each of the two outer electrodes in the impedimetric sensor. As shown in FIG. 9, an AC voltage signal is applied to the middle electrode, which generated an electric field between the middle electrode and each of the two outer electrodes. A current signal was then measured from each of the two outer electrodes. When each electric field was disturbed by a passing cell, an impedance was introduced between the center electrode and the corresponding outer electrode, which manifested itself as a pulse in the current at that outer electrode. Since this sensor was present in a linear channel with no alternative routes, each passing cell resulted in a pulse in each outer electrode current consecutively. In this way, the impedimetric sensor functions as a micro-cytometer, recording information about each cell that passes through the sensing region.

Signal Processing and Amplification

The devices described here utilized a coplanar electrode system (FIG. 4A) as an impedimetric counter to collect the relevant cell count data. An AC voltage signal was applied to the middle electrode and a cell was passed through the sensing region. The resulting unipolar current signal pulse occurred at each of the outer electrodes. In view of the scale of these signals and the background noise levels present in the system, some signal processing techniques were applied in order to increase the signal-to-noise ratio and obtain an accurate read of the data collected by the impedimetric counter.

Figure 10A:
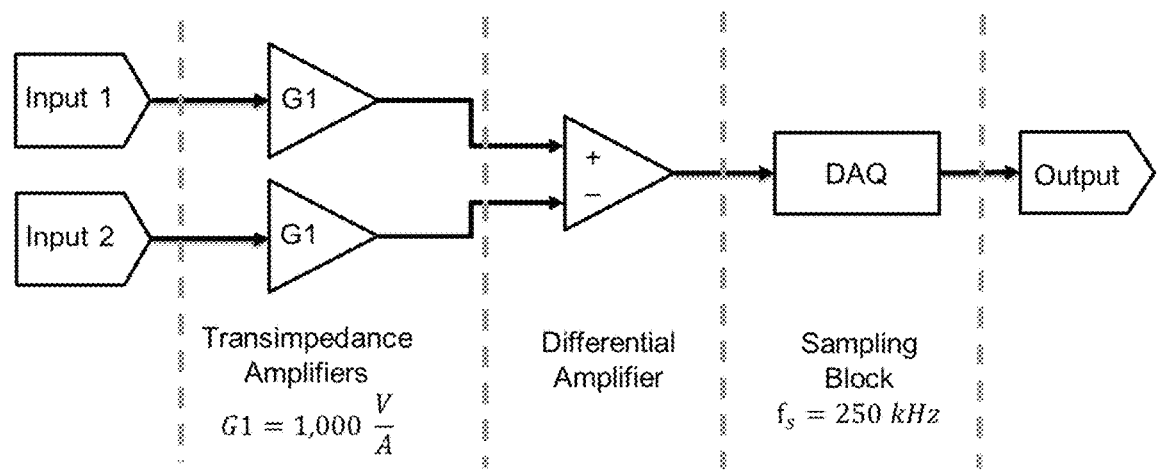
FIG. 10A shows a signal amplification flowchart. DAQ (Data Acquisition Card).

The two unipolar current signals that carry the information relevant to each passing cell were initially too small to be analytically useful, so they were amplified as shown in FIG. 10A. First, each current signal was passed through a transimpedance amplifier with a gain of 1,000 V/A in order to convert them to voltage signals and amplify the scales at which the signals were analyzed. This was performed using a Zurich Instruments HF2TA Current Amplifier. Then, both voltage signals were passed through a differential amplifier in order to eliminate common-mode noise and form the bipolar pulse signature, i.e., a single bipolar voltage signal. The resulting relevant data signal was a more distinct form, thereby resulted in the reduction of the likelihood of both false negatives and false positives. At this point, the signal was also demodulated. This was performed using a Zurich Instruments HF2LI Lock-in Amplifier, which eliminated any remaining noise that may have been present due to debris (e.g., cellular debris after lysis) in the sample. For this design, the processing occurred off of the device (e.g., off-chip). The differential signal received from the lock-in amplifier was sampled at a rate of 250 kHz and recorded.

Digital Signal Processing

Figure 10B:
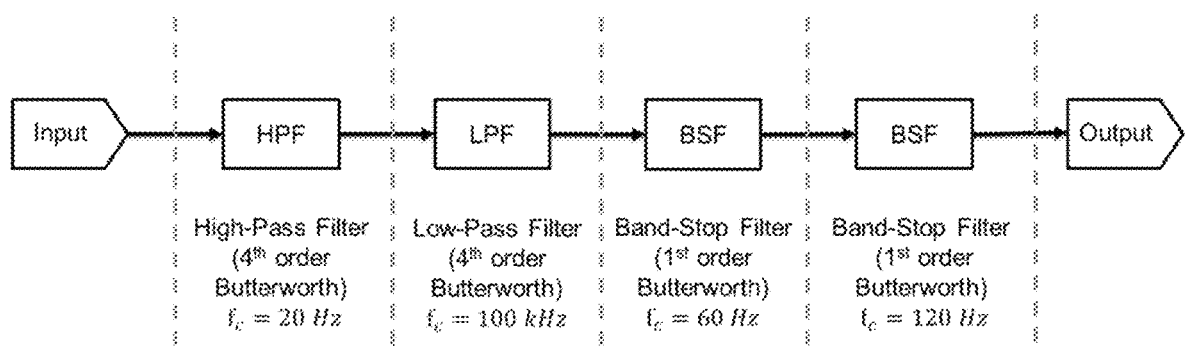
FIG. 10B illustrates a signal processing flowchart.

Before analyzing the amplified and sampled voltage signal, digital signal processing techniques was applied to the data in order to reduce the noise present in the signal and improve the ease of data analysis. Several digital filtering stages were used to achieve this as shown in FIG. 10B. First, the sampled signal was passed through a $4^{th}$ order Butterworth high-pass filter (HPF) with an effective cutoff of 20 Hz. This filter eliminated any baseline drift that was present in the signal and set the data to a steady DC baseline of 0 V. Next, the signal was passed through a 4th order Butterworth low-pass filter (LPF) with an effective cutoff of 100 kHz. This filter attenuated some of the high-frequency noise that disrupted the signal. Finally, the signal was passed through two 1st order Butterworth notch filters: one centered at 60 Hz and another at 120 Hz (band-stop filter (BSF)). These filters removed 60 Hz transmission line noise as well as its 120 Hz harmonic. Additional notch filters implemented to remove subsequent harmonic frequencies; however, they offered diminishing returns in terms of improvements in SNR. It is important to note that 60 Hz was chosen as the appropriate transmission line frequency for testing performed in the United States, however many countries used a 50 Hz transmission line frequency, so the notch filters can have to be adjusted if testing were performed in another country.

Example 10

System Calibration

The required specifications of this signal processing system can differ depending on the analyte intended to count, so the system must be calibrated before experimental use. In order to calibrate for the desired analyte (i.e., leukocytes), the system was tested with a solution containing 9-micron polystyrene beads (Spherotech, Inc.) which roughly resembled the size and shape of the desired analyte. A solution (10 µl) containing 2.5% weight by volume of the polystyrene beads was diluted with 90 microliters phosphate buffered saline (PBS) to create a stock solution that contained roughly 6,300 polystyrene beads per microliter.

Figure 11:
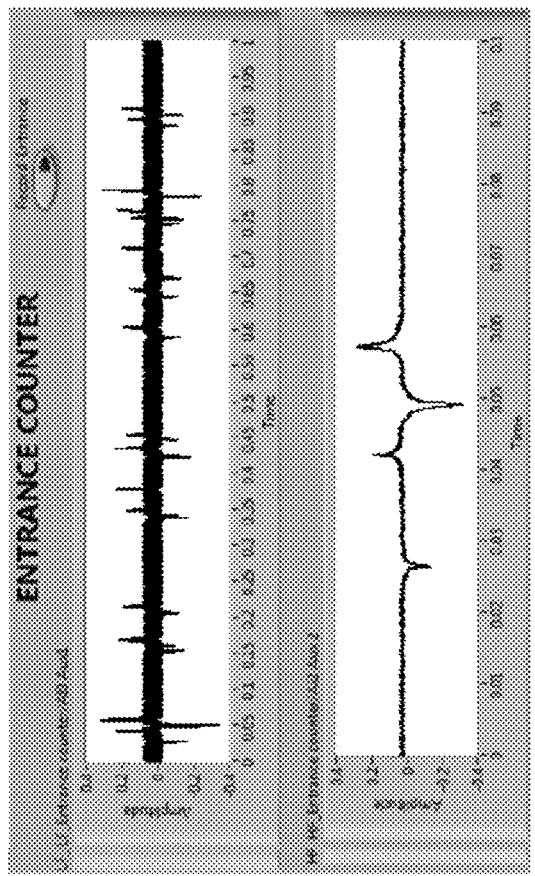
FIG. 11 presents a processed signal generated by passing polystyrene beads over the coplanar electrode system at two different timescales; 1 sec (top; Low Frequency (LF)) and 0.1 sec (bottom; High Frequency (HF)) as acquired using NI DAQ Card in LABVIEW software.

This solution was flowed through the microfluidic channel with the electrodes connected to a signal processing signal from the lock-in amplifier without saturating it, the carrier signal applied to the middle electrode had a frequency of 303 kilohertz and a peak-to-peak amplitude of 10 volts, and the system had an overall gain of 10. An example of the output pulses received during the calibration experiment is shown in FIG. 11.

Example 11

Signal Pulse Characterization and Statistical Analysis

Qualitative Pulse Analysis

Figure 12:
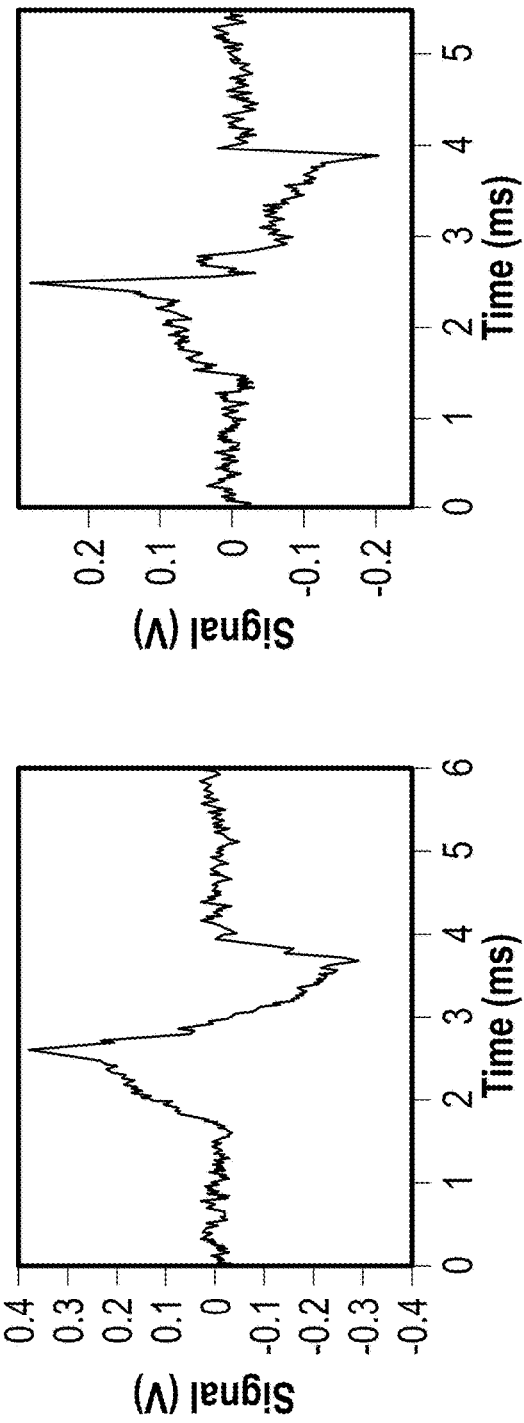
FIG. 12 presents electrical signatures generated by a control population phagocyte (without particles) (left) and an experimental population phagocyte (with particles) (right).

The ultimate goal of this design was to alter the flow of functional phagocytes in a biological sample in such a way that it could be detected by a micro-cytometer. In order to form a preliminary surface-level qualitative determination regarding whether or not the goal was met, several individual pulses were analyzed from both control populations and experimental populations of the same biological samples. As can be seen in FIG. 12, electrical pulses generated by phagocytes that did contain internalized ferromagnetic microparticles showed noticeably distinct electrical signatures when compared to pulses generated by phagocytes in the control population from the same sample.

Quantitative Statistical Analysis

Figure 13:
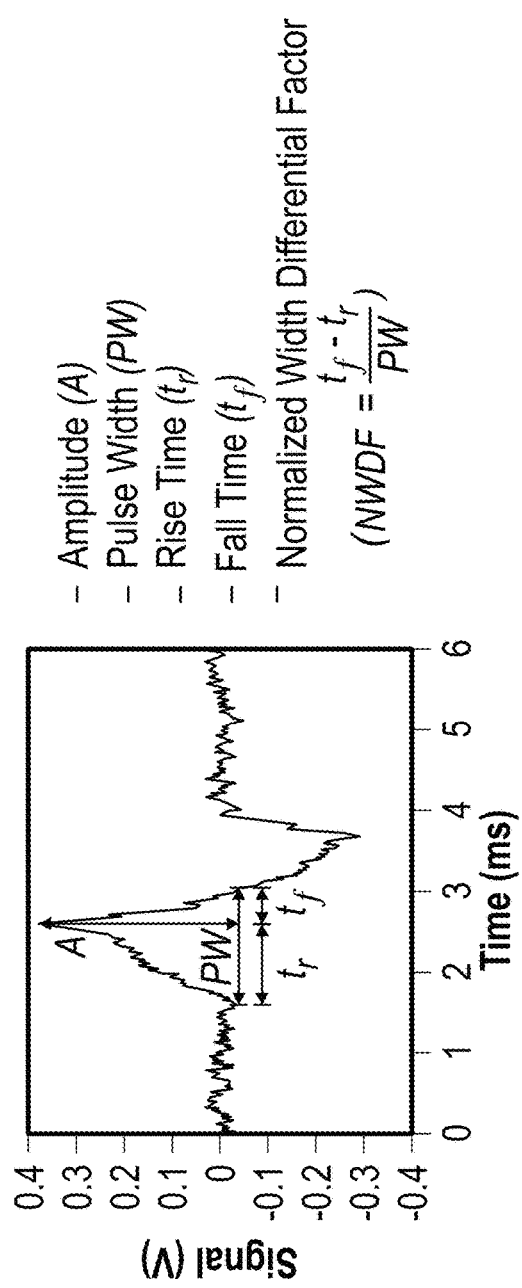
FIG. 13 shows pulse characterization metrics of a single cell electrical signature. Amplitude (A); Pulse Width (PW); Rise Time (6); Fall Time ($t_f$); Normalized Width Differential Factor (NWDF=tf-tr/PW).

In total, 17 biological samples were tested using this device. From each sample, both a control population and an experimental population were tested, providing a total of 34 individual datasets. In order to form a more generalized determination on the effectiveness of the proposed biosensing framework, every pulse in each dataset collected by the device was characterized by a uniform set of metrics and a statistical analysis was performed on those characterizations. To determine the presence of a pulse in a dataset as opposed to electrical noise, a threshold of 50 mV was set. An algorithm was developed to scan a complete dataset and record five characterization metrics of every pulse that passed this threshold: amplitude, pulse width, rise time, fall time, and normalized width differential factor (NWDF) as shown in FIG. 13. The NWDF is a unique metric defined as the normalized difference between the rise and fall times. At this time, only the positive half of every pulse was characterized due to a technical failure that occurred during the collection of several datasets which resulted in the loss of the negative half of the pulse. In order to be able to keep characterization metrics uniform across all datasets, characterizations involving the negative half of the pulse were not included. However, the inclusion of these additional metrics can lead to improvements in the results of this biosensing framework.

Figure 14A:
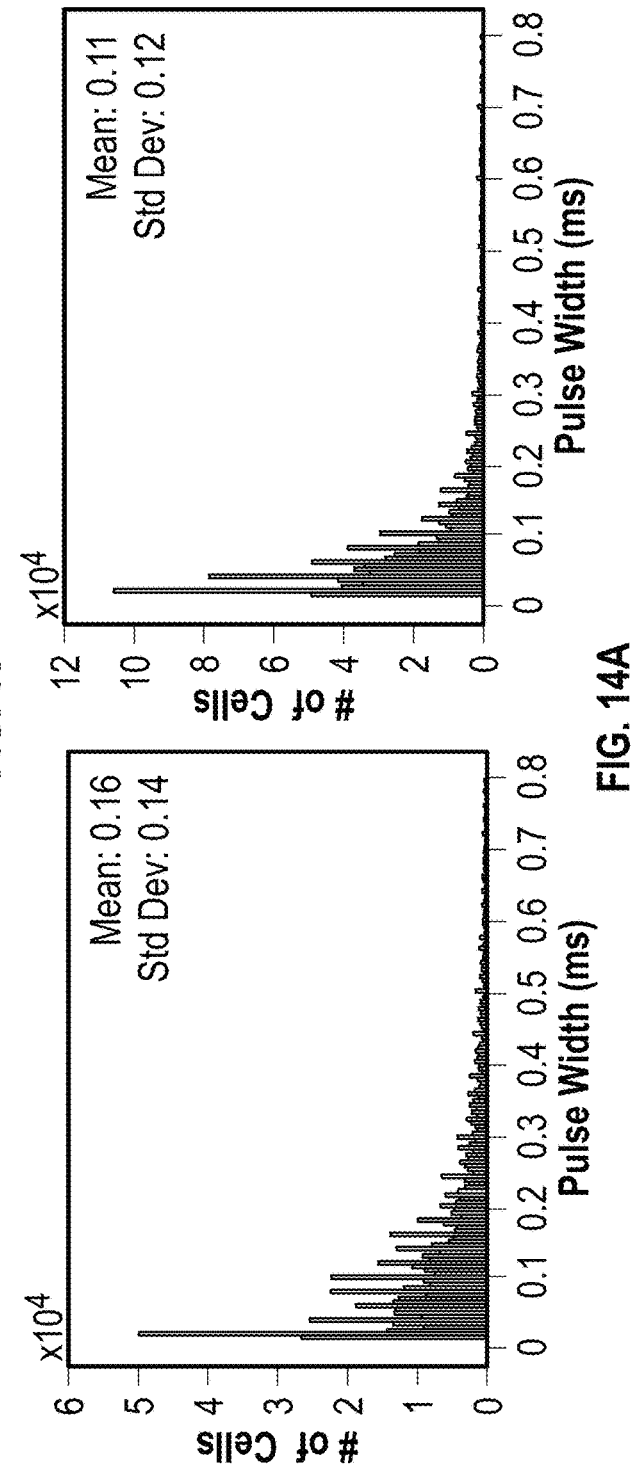
FIG. 14A illustrates pulse width histograms for control population (without particles; left) and experimental population (with particles; right) of the same biological sample.

The mean and standard deviation of all five characterizations were analyzed for both the control and experimental populations in order to find a trend that could be used as a diagnostic variable to determine whether or not a population contained phagocytes that successfully phagocytosed opsonized microparticles. The pulse width of every pulse was related to the speed at which the corresponding cell was flowing. The mean pulse width decreased in the experimental population as compared the control population in most of the samples tested. A histogram of the pulse widths in both the control and experimental populations for a single biological sample are shown in FIG. 14A.

Figure 14B:
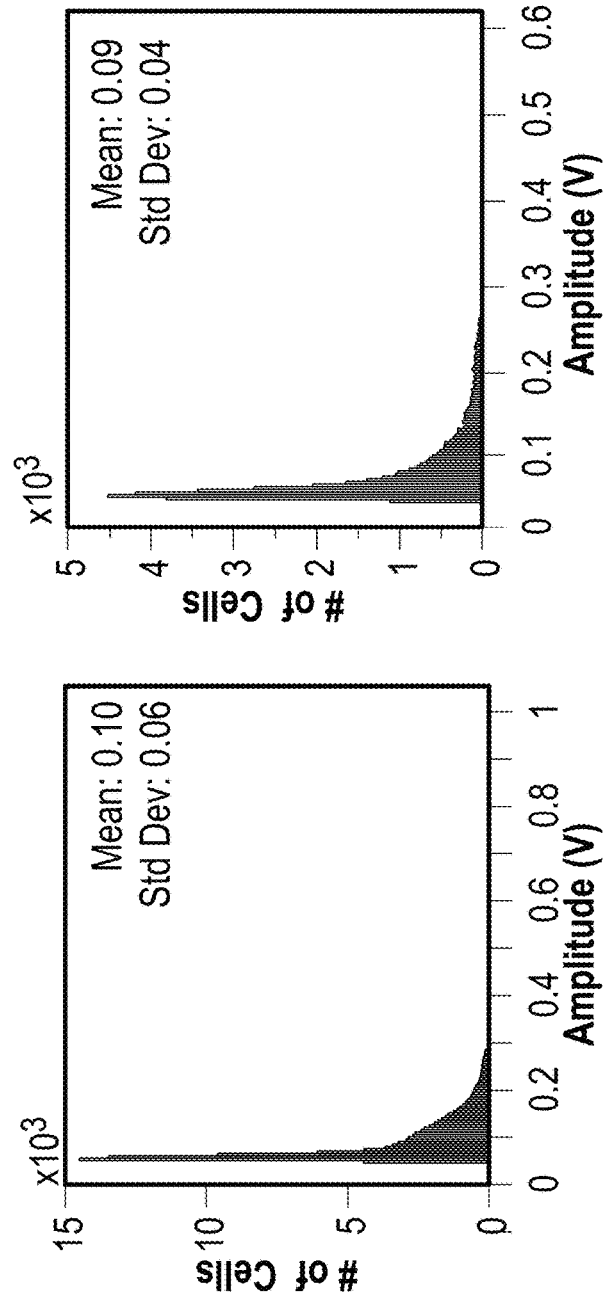
FIG. 14B provides pulse amplitude histograms for control population (without particles; left) and experimental population (with particles; right) of the same biological sample.

The amplitude of the pulse can also be altered by the presence of ferromagnetic microparticles inside a cell. The pulse amplitude was related to both the volume and the conductivity of the cell generating the pulse. Therefore, the inclusion of electrically conductive ferrous particles inside a cell can reduce the cell's amplitude by increasing its effective conductivity. For this reason, the mean and standard deviation of the pulse amplitudes for both control and experimental populations of all biological samples were also analyzed. The amplitude did indeed decrease in the experimental population as compared to the control population in the majority of the samples tested. A histogram of the pulse amplitudes in both the control and experimental populations of a single biological sample are shown in FIG. 14B.

Due to the fact that the quadrupole magnet configuration generated a strong magnetic field in only a small length of the microfluidic channel, it was postulated that the velocity of phagocytes with internalized ferromagnetic microparticles can not be uniform throughout the sensing region. For instance, the magnetic field can cause a phagocyte to flow faster at the beginning of its pulse and slower at the end or vice versa depending on the alignment of the magnets with the electrodes. For this reason, the pulse width of every pulse was broken down further into three additional characterizations: the rise time, the fall time, and the NWDF. A paired-sample t-test was performed for all five characteristic metrics and concluded that the difference between the control and experimental populations for each metric was not statistically significant.

Example 12

Neural Network Application and Results

Since no individual characterization parameter resulted in a statistically significant distinct metric for phagocytic detection and quantification, a neural network was developed to characterize the datasets based on all five metrics in conjunction in order to improve the accuracy of detection. Additionally, a second neural network was developed to serve as a sepsis diagnosis network based on data collected from the experimental populations. Both the mean and standard deviation of all five characterization metrics were used as inputs to the two networks, for a total of 10 input variables. The Deep Learning Toolbox on MATLAB was utilized to automatically generate, train, validate, and test both neural networks.

Phagocytic Detection Network

Figure 15:
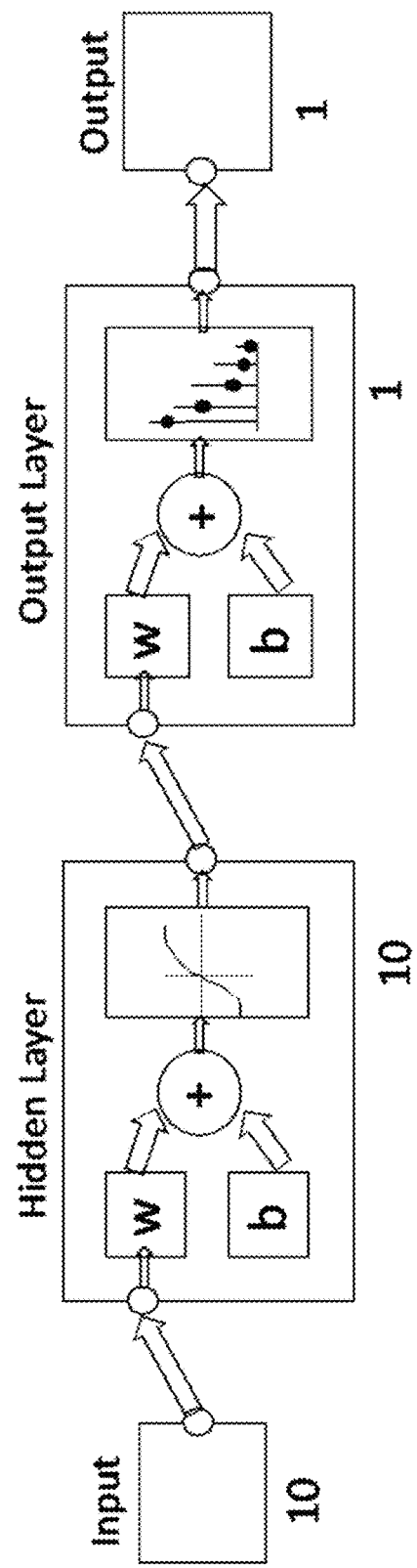
FIG. 15 presents a diagram of two-layer feedforward neural network with 10 hidden neurons.

The first pattern recognition network was developed to detect the presence of internalized ferromagnetic microparticles in a sample, as this would indicate that the sample contained functional phagocytes. The 10 characterization variables of all 34 datasets were used as inputs to network, and the true presence of ferromagnetic microparticles was used as a binary target for the network (1 for the experimental populations and 0 for the control populations). The binary output of the network represented the detected presence of ferromagnetic microparticles (1 if the network detected the presence of microparticles and 0 if it did not). Using the Deep Learning Toolbox, a two-layer feedforward network was created with 10 neurons and a sigmoid activation function in the hidden layer and a softmax activation function in the output layer as shown in FIG. 15. The 34 available datasets were divided as follows: 60% for training, 20% for validation, and 20% for testing.

Figures 16A, 16B:
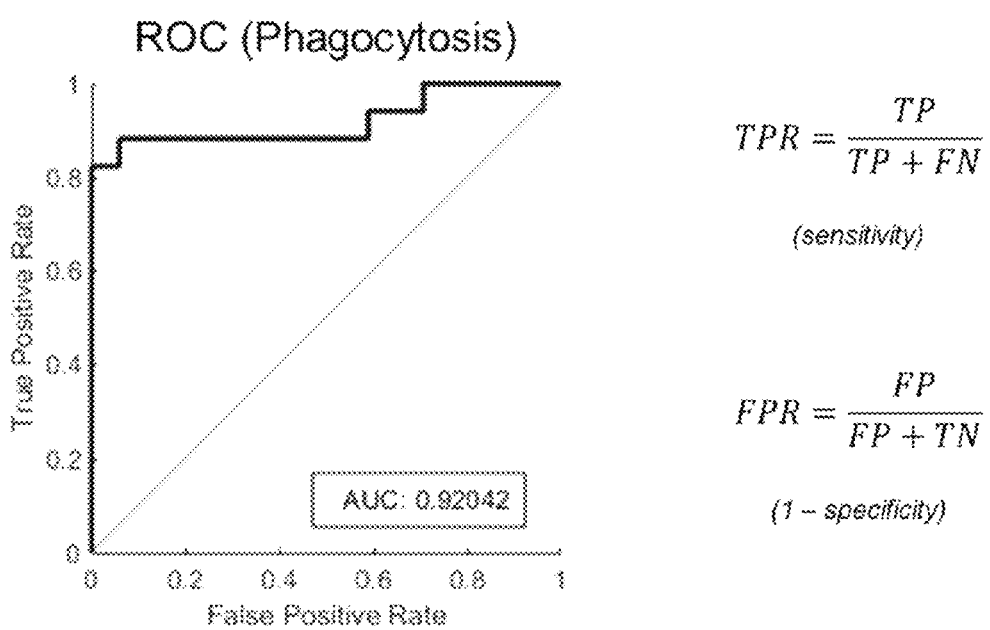
FIG. 16A shows a confusion matrix for the phagocytic cell detection network.
FIG. 16B provides a Receiver Operating Characteristic (ROC) curve for the phagocytic cell detection network. True Positive Rate (TPR); True Positive (TP); False Negative (FN); False Positive Rate (FPR); False Positive (FP); True Negative (TN); Area Under the Curve (AUC).

After training, validating, and testing this network, its performance was evaluated using two distinct tools. The first tool used is a confusion matrix, which evaluated the number of datasets for which the target and the output were both positive (true positive), the number of datasets for which the target and the output were both negative (true negative), the number of datasets for which the target was negative and the output was positive (false positive), and the number of datasets for which the target was positive and the output was negative (false negative). Using this information, an overall success rate was determined, which defined how often the network's determination was correct according to the targets. The confusion matrix for the phagocytic detection network is shown in FIG. 16A. Of the 17 datasets that came from the control populations and did not contain any internalized ferromagnetic microparticles, 16 were correctly identified by the network. Of the 17 datasets that came from the experimental populations and did contain internalized ferromagnetic microparticles, 14 were correctly identified by the network. Thus, the success rate for functional phagocyte detection by this pattern recognition network was 88.2%.

The second tool used to evaluate the network's performance is a Receiver Operating Characteristic (ROC) curve, and it is a plot used to demonstrate a diagnostic system's performance as its diagnostic threshold is varied. With this curve, the vertical axis was taken to be the True Positive Rate (TPR) which was defined as the proportion of actual positive cases that the diagnostic system identified as positive. This parameter was also known as the sensitivity of the system. The horizontal axis was taken to be the False Positive Rate (FPR) which was defined as the proportion of actual negative cases that the diagnostic system identified as positive. This parameter was related to the specificity of the system such that FPR=1−specificity. When evaluating an ROC curve, the area under the curve (AUC) was used as a clear metric for pattern recognition performance in which an AUC of 1 was indicative of a perfect diagnostic method and an AUC of 0.5 was indicative of a diagnostic system that is statistically as effective as randomly guessing an output. The ROC curve for the phagocytic detection network is shown in FIG. 16B. This network performed with an AUC of 0.92.

Sepsis Detection Network

The second pattern recognition network was developed to diagnose sepsis based on the phagocytic performance of a biological sample. For this network, only the characterization variables from the 17 datasets derived from the experimental populations of each biological sample were used as inputs since these datasets contained information regarding the phagocytic capability of the subject. The true sepsis diagnosis based on the serum lactate concentration of the subject was used as a binary target for the network (1 for samples with lactate levels greater than or equal to 2.0 mmol/L and 0 for samples with lactate levels less than 2.0 mmol/L). The binary output of the network represented the diagnosis as determined by the network (1 if the network determined the subject was septic and 0 if the network determined the subject was not septic). The same two-layer feedforward network structure as shown in FIG. 15 was used again for this network. The 17 available datasets were divided as follows: 60% for training, 20% for validation, and 20% for testing.

Figures 17A, 17B:
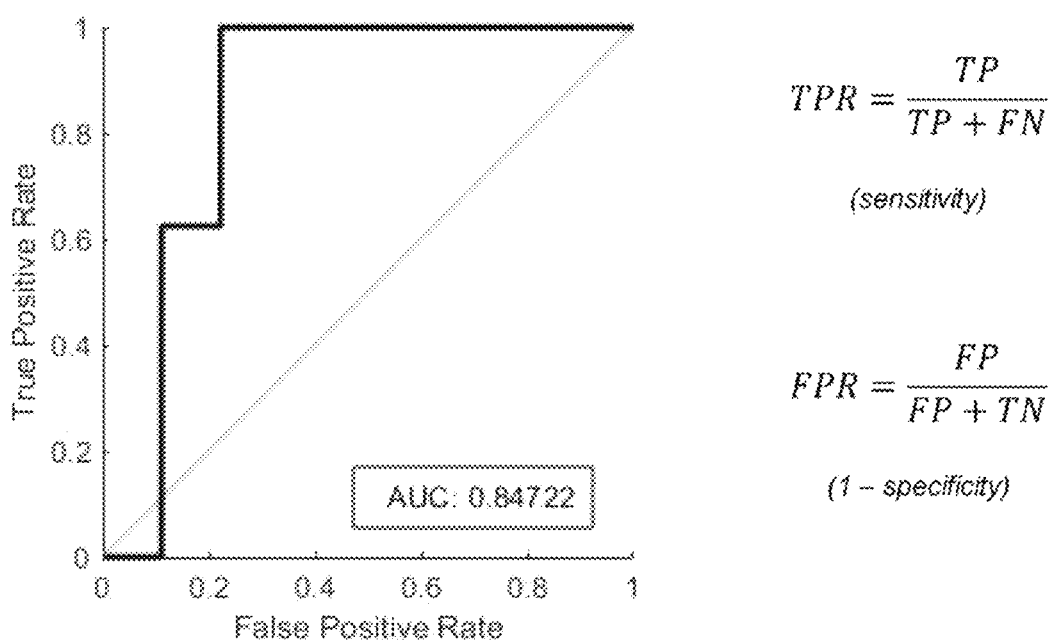
FIG. 17A illustrates a confusion matrix for the sepsis cell detection network.
FIG. 17B presents a Receiver Operating Characteristic (ROC) curve for the sepsis cell detection network.

After training, validating, and testing this network its performance was evaluated using the same tools as the previous network. The confusion matrix for the sepsis detection network is shown in FIG. 17A. Of the 9 datasets that came from subjects with lactate levels below 2.0 mmol/L, 7 were correctly diagnosed by the network. Of the 8 datasets that came from subjects with lactate levels greater than or equal to 2.0 mmol/L, all 8 were correctly diagnosed by the network. Thus, the success rate for sepsis detection by this pattern recognition network was 88.2%. Additionally, the ROC curve for the sepsis detection network is shown in FIG. 17B. This network performed with an AUC of 0.85.

Example 13

Off-Chip Phagocytosis Experimental Protocol

To determine the effective accuracy of the device and methods described here, a phagocytic control assay was developed using traditional clinical diagnostic procedures. For this control assay, erythrocytes in a blood sample were lysed in distilled water and the lysing process was quenched using phosphate buffered saline (PBS). Any debris in the sample due to the cytolysis was then removed by centrifugation and the remaining leukocytes were transferred to a 24 well plate with a density of approximately $6 \times 10^5$ cells per well.

The leukocytes in these wells were introduced to fluorescently labeled polystyrene beads that were conjugated with anti-human immunoglobulin G (IgG) antibodies. The sample was then incubated at 37° Celsius for 40 minutes to facilitate phagocytosis of the fluorescent beads. The wells were then rinsed to remove any excess beads. Finally, the cells were stained with both nuclear and cytoskeletal stains, and the sample was observed under a fluorescent microscope. As seen under a fluorescent microscope, resulting cells included, for example, two stained phagocytes with ingested green fluorescent polystyrene beads. The number of beads internalized by each phagocyte were quantified and directly indicative of the that cell's phagocytic ability. Because the pulse width of the signals received in the proposed design was also directly indicative of a cells' phagocytic ability, the control assay allowed for verification of the results obtained by the impedimetric counting system described here.

Specific Embodiments

Non-limiting specific embodiments are described here each of which is considered to be within the present disclosure.

As various changes can be made in the above-described subject matter without departing from the scope and spirit of the present disclosure, it is intended that all subject matter contained in the above description, or defined in the appended claims, be interpreted as descriptive and illustrative of the present disclosure. Many modifications and variations of the present disclosure are possible in light of the above teachings. Accordingly, the present description is intended to embrace all such alternatives, modifications and variances which fall within the scope of the appended claims.

All documents cited or referenced herein and all documents cited or referenced in the herein cited documents, together with any manufacturer's instructions, descriptions, product specifications, and product sheets for any products mentioned herein or in any document incorporated by reference herein, are hereby incorporated by reference, and can be employed in the practice of the disclosure.

The invention claimed is:

1. A method, comprising:
applying a sample to a device,
wherein the device comprises:
a substrate;
at least two electrodes;
a microfluidic channel comprising at least one inlet and an outlet; and
at least one magnet; wherein the at least two electrodes are disposed on the substrate,
wherein the microfluidic channel is disposed in proximity to the at least two electrodes on the substrate,
wherein the at least two electrodes are configured to generate an electric field, and
wherein the at least one magnet is configured to provide a magnetic field in
at least a portion of the microfluidic channel,
wherein the sample comprises at least one cell;
incorporating at least one magnetic particle to the sample;
applying an input voltage of at least a single frequency to the at least two electrodes, generating an electric field;
passing the sample from the at least one inlet to the outlet of the microfluidic channel through the electric field;
a current signal from each of the at least two electrodes producing a pulse; and detecting the pulse,
wherein the pulse comprises: an absolute amplitude of 0 V-1 V; a pulse width of 0.02 ms-2 ms; a rise time of 0.01 ms -1 ms; a fall time of 0.01 ms -1 ms; a normalized width differential factor (NWDF) of -0.1-0.1; or combinations thereof.

2. A method, comprising:
applying a sample to a device,
wherein the device comprises:
a substrate;
at least two electrodes;
a microfluidic channel comprising at least one inlet and an outlet; and
at least one magnet;
wherein the at least two electrodes are disposed on the substrate,
wherein the microfluidic channel is disposed in proximity to the at least two electrodes on the substrate,
wherein the at least two electrodes are configured to generate an electric field, and
wherein the at least one magnet is configured to provide a magnetic field in at least a portion of the microfluidic channel,
wherein the sample comprises at least one cell;
incorporating at least one magnetic particle to the sample;
applying an input voltage of at least a single frequency to the at least two electrodes, generating an electric field;
passing the sample from the at least one inlet to the outlet of the microfluidic channel through the electric field;
measuring a current signal from each of the at least two electrodes, producing a pulse; and
detecting the pulse,
wherein a pulse of the at least one cell of the sample with the at least one magnetic particle comprises an amplitude, a pulse width, a rise time, a fall time, a NWDF, or combinations thereof less than that in a pulse of a cell without at least one magnetic particle.

3. A method, comprising:
applying a sample to a device,
wherein the device comprises:
a substrate;
at least two electrodes;
a microfluidic channel comprising at least one inlet and an outlet; and
at least one magnet;
wherein the at least two electrodes are disposed on the substrate,
wherein the microfluidic channel is disposed in proximity to the at least two electrodes on the substrate,
wherein the at least two electrodes are configured to generate an electric field, and
wherein the at least one magnet is configured to provide a magnetic field in at least a portion of the microfluidic channel,
wherein the sample comprises at least one cell;
incorporating at least one magnetic particle to the sample;
applying an input voltage of at least a single frequency to the at least two electrodes, generating an electric field;
passing the sample from the at least one inlet to the outlet of the microfluidic channel through the electric field;
measuring a current signal from each of the at least two electrodes, producing a pulse; and
detecting the pulse,
wherein a pulse of the at least one cell of the sample with the at least one magnetic particle comprises an amplitude, a pulse width, a rise time, a fall time, and a NWDF less than an amplitude, a pulse width, a rise time, a fall time, and a NWDF of a pulse of a cell without at least one magnetic particle.

4. The method of claim 1, further comprising amplifying the current signal.

5. The method of claim 2, further comprising amplifying the current signal.

6. The method of claim 3, further comprising amplifying the current signal.

7. The method of claim 1, further comprising detecting the presence or absence of at least one phagocytic cell.

8. The method of claim 2, further comprising detecting the presence or absence of at least one phagocytic cell.

9. The method of claim 3, further comprising detecting the presence or absence of at least one phagocytic cell.

10. The method of claim 1, wherein the sample comprises at least one phagocytic cell.

11. The method of claim 2, wherein the sample comprises at least one phagocytic cell.

12. The method of claim 3, wherein the sample comprises at least one phagocytic cell.

13. The method of claim 1, further comprising quantifying a number of internalized magnetic particles.

14. The method of claim 2, further comprising quantifying a number of internalized magnetic particles.

15. The method of claim 3, further comprising quantifying a number of internalized magnetic particles.

* * * * *